(12) United States Patent
Okazaki et al.

(10) Patent No.: US 7,816,207 B2
(45) Date of Patent: Oct. 19, 2010

(54) SEMICONDUCTOR DEVICE HAVING ELECTRODE AND MANUFACTURING METHOD THEREOF

(75) Inventors: Tsutomu Okazaki, Tokyo (JP); Motoi Ashida, Tokyo (JP); Hiroji Ozaki, Tokyo (JP); Tsuyoshi Koga, Tokyo (JP); Daisuke Okada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/719,524

(22) Filed: Mar. 8, 2010

(65) Prior Publication Data
US 2010/0159687 A1 Jun. 24, 2010

Related U.S. Application Data

(62) Division of application No. 11/649,208, filed on Jan. 4, 2007, now Pat. No. 7,709,874.

(30) Foreign Application Priority Data
Jan. 4, 2006 (JP) ............................. 2006-000141

(51) Int. Cl.
*H01L 21/336* (2006.01)
(52) U.S. Cl. ................. 438/257; 438/260; 438/265; 438/267; 438/288; 257/E21.68
(58) Field of Classification Search ................. 438/257, 438/260, 265, 267, 271, 286, 288; 257/E21.68
See application file for complete search history.

(56) References Cited

U.S. PATENT DOCUMENTS

2005/0260814 A1* 11/2005 Cho et al. .................. 438/257

2005/0263816 A1* 12/2005 Tseng .......................... 257/316
2005/0282337 A1* 12/2005 Shyu et al. .................. 438/257

FOREIGN PATENT DOCUMENTS

JP 63-257231 A 10/1988

(Continued)

OTHER PUBLICATIONS

Choi et al. "Highly Scalable and Reliable 2-bit/cell SONOS Memory Transistor beyond 50nm NVM Technology Using Outer Sidewall Spacer Scheme with Damascene Gate Process". IEEE 2005 Symposium on VLSI Technology Digest of Technical Papers, 118-119.

*Primary Examiner*—Thanh V Pham
(74) *Attorney, Agent, or Firm*—McDermott Will & Emery LLP

(57) ABSTRACT

A manufacturing method of a semiconductor device includes a first electrode formation step of forming a control gate electrode above a surface of a semiconductor substrate with a control gate insulating film interposed between the control gate electrode and the semiconductor substrate, a step of forming a storage node insulating film on the surface of the semiconductor substrate, and a second electrode formation step of forming a memory gate electrode on a surface of the storage node insulating film. The second electrode formation step includes a step of forming a memory gate electrode layer on the surface of the storage node insulating film, a step of forming an auxiliary film, having an etching rate slower than that of the memory gate electrode layer, on a surface of the memory gate electrode layer, and a step of performing anisotropic etching on the memory gate electrode layer and the auxiliary film.

3 Claims, 25 Drawing Sheets

FOREIGN PATENT DOCUMENTS

| | | |
|---|---|---|
| JP | 11-145471 A | 5/1999 |
| JP | 2003-100916 A | 4/2003 |
| JP | 2003-309193 A | 10/2003 |
| JP | 2004-111629 A | 4/2004 |

* cited by examiner

|  | Vmg | Vs | Vcg | Vd | Vsub |
|---|---|---|---|---|---|
| Read(V) | 1.5 | 0 | 1.5 | 1 | 0 |
| Write(V) | 12 | 5 | 1.5 | 1 | 0 |
| Erase(V) | −5 | 7 | 0 | OPEN | 0 |

SEMICONDUCTOR DEVICE HAVING ELECTRODE AND MANUFACTURING METHOD THEREOF

CROSS-REFERENCE TO RELATED APPLICATIONS

This application is a Divisional of U.S. application Ser. No. 11/649,208, filed on Jan. 4, 2007, now U.S. Pat. No. 7,709,874 claiming priority of Japanese Patent Application No. 2006-000141, filed on Jan. 4, 2006, the entire contents of each of which are hereby incorporated by reference.

BACKGROUND OF THE INVENTION

1. Field of the Invention

The present invention relates to a semiconductor device and a manufacturing method thereof.

2. Description of the Background Art

An example of a nonvolatile memory includes an EPROM (Erasable and Programmable Read Only Memory) which is a ROM capable of electrically rewriting data. An EPROM is generally classified into a UV-EPROM using ultraviolet rays for data erase and an EEPROM (Electrical Erasable and Programmable Read Only Memory) electrically erasing data. An EEPROM does not erase data partially, but erases all pieces of data and, then, writes data to each memory cell.

An EEPROM can be mounted to a microcomputer for a mobile telephone, a digital home appliance or the like. For example, it is possible to form a semiconductor integrated circuit in which such an EEPROM and a CPU (Central Processing Unit) are formed on a surface of a chip.

An EEPROM includes an ONO (Oxide Nitride Oxide) film serving as a charge accumulation film for accumulating electrical charge in some cases. An EEPROM has, for example, a MONOS (Metal Oxide Nitride Oxide Semiconductor) structure using an ONO film or a SONOS (Silicon Oxide Nitride Oxide Semiconductor) structure. For example, data is written to such a nonvolatile memory when electrons are injected into an ONO film. In addition, data is erased from the nonvolatile memory when holes are injected into the ONO film and, then, are recombined with the accumulated electrons.

Japanese Patent Laying-Open No. 2003-309193 discloses a memory cell transistor having the following structure. That is, a pair of memory electrodes one of which is set at a source electrode and the other one of which is set at a drain electrode mutually and a channel region interposed between the pair of memory electrodes are formed on a first well region. Further, a first gate electrode is provided near the memory electrode on the channel region with an insulating film interposed between the first gate electrode and the channel region. A second gate electrode is also provided on the channel region with an insulating film and a charge accumulation region each interposed between the second gate electrode and the channel region, and is electrically isolated from the first gate electrode.

Japanese Patent Laying-Open No. 2003-100916 discloses a MONOS-type nonvolatile memory device in which a word gate, an impurity layer and sidewall-shaped first and second control gates are formed on a first gate insulating film formed on a semiconductor substrate. Herein, each of the first and second control gates has a rectangular sectional shape.

In Byung Yong Choi, et al., "Highly Scalable and Reliable 2-bit/cell SONOS Memory Transistor beyond 50 nm NVM Technology Using Outer Sidewall Spacer Scheme with Damascene Gate Process", IEEE 2005 Symposium on VLSI Technology Digest of Technical Papers, pp. 118-119, there is described a two-bit/cell SONOS memory transistor beyond 50 nm NVM technology. In a method for manufacturing such a memory transistor, first, an ONO film is formed on a surface of a semiconductor substrate. Then, in the ONO film, a portion corresponding to a substantially center of a channel is removed; thus, two separated storage nodes are formed. This memory exhibits high reliability even when being finely manufactured so as to have a gate length of 80 nm.

Japanese Patent Laying-Open No. 2004-111629 discloses a manufacturing method of a MONOS memory. This manufacturing method includes: forming a first gate insulating layer above a semiconductor substrate; forming a first conductive layer word gate and a stopper layer; forming a first insulating layer and a second insulating layer on an entire memory region; performing anisotropic etching on the second insulating layer, thereby forming a first sidewall conductive layer; forming a third conductive layer on the entire memory region; performing anisotropic etching on the third conductive layer, thereby forming a second sidewall conductive layer; and performing isotropic etching on the first and second sidewall conductive layers, thereby forming a control gate.

Japanese Patent Laying-Open No. 11-145471 discloses a semiconductor device in which an element isolation region is formed on a semiconductor substrate and a gate electrode is formed on the semiconductor substrate with a gate insulating film interposed between the gate electrode and the semiconductor substrate. Herein, an insulating film having a thickness "a" is formed on a top face of the gate electrode, and a sidewall having a thickness "b" at a lowermost side is formed on a side face of the gate electrode. The thickness of the sidewall at the height of "a" from the top face of the gate electrode is not less than "b", wherein "a"≧"b".

A memory having a MONOS structure of a split gate type includes a control gate electrode of a control transistor and a memory gate electrode of a MONOS transistor. The memory gate electrode is provided beside the control gate electrode with an insulating film interposed between the memory gate electrode and the control gate electrode. An ONO film serving as a charge accumulation film is formed between the memory gate electrode and a semiconductor substrate.

In the memory having the MONOS structure of the split gate type, the memory gate electrode is formed as a sidewall of the control gate electrode. More specifically, the control gate electrode is formed by photolithography through a mask. On the other hand, the memory gate electrode is formed by etching in a self aligned manner. The memory gate electrode has an inclined top face in a sectional shape thereof. In other words, the top face gradually becomes low in height toward an outer side. The memory gate electrode is high in height on a side near the control gate electrode and gradually becomes low in height toward an outer side.

In a step of forming a diffusion layer such as a source region or a drain region on a semiconductor substrate, ion implantation is performed in a self aligned manner while using the control gate electrode or the memory gate electrode as a mask. Since the outer side of the memory gate electrode is low in height, ions implanted upon performance of the ion implantation transmit through the memory gate electrode and, then, reach the charge accumulation film in some cases. Consequently, there arises a problem that the ONO film serving as the charge accumulation film is degraded.

There is a design rule as a parameter indicating a level of microfabrication. In a case that a manufacturable minimum dimension is set as such a design rule, recently, a semiconductor device is manufactured below a 90 nm rule. In a photolithography step upon manufacturing of a fine semiconductor device, an ArF light source is used as a light source for exposure, in place of a conventional KrF light source. If the ArF light source is used, a fine circuit can be formed. However, it is necessary to make a portion to be exposed, such as a resist, thin. If the resist is thin, a depth capable of performing etching becomes shallow in an etching step after development of the resist.

In a semiconductor device, for example, an interlayer insulating film is formed on a top face of a memory cell. The interlayer insulating film is formed for planarizing a surface and is provided on the top face of the memory cell. An interconnection is provided on the surface of the interlayer insulating film, for example. In order to electrically connect between the interconnection and the memory cell, a contact is formed so as to pass through the interlayer insulating film. Upon formation of the contact, a through hole, which has a length equal to a sum of a height of the memory cell and a height from a top of the memory cell to the surface of the interlayer insulating film, must be formed in the interlayer insulating film.

In the semiconductor device in accordance with the design rule below a 90 nm rule, however, the ArF light source is used for exposure. Therefore, there arises a problem that the resist becomes thin in thickness, so that a contact hole passing through the interlayer insulating film cannot be formed in a step of forming a contact hole. To this end, there is required that a thickness of an interlayer insulating film is made thin in a semiconductor device including a memory cell.

In order to prevent that ions are implanted into a charge accumulation film, it is considered that a height of a memory gate electrode is made high. However, if the height of the memory gate electrode is high, there arises a problem that a thickness of an interlayer insulating film becomes large. Alternatively, in order to prevent that ions are implanted into a charge accumulation film, it is considered that energy of ions to be implanted is made small in an ion implantation step. However, the energy of the ions to be implanted is determined based on necessity of countermeasures against shortcircuit failure between a diffusion layer and a substrate upon silicidation. Consequently, there arises a problem that it is impossible to make the energy of the ions to be implanted small.

As a semiconductor circuit is formed finely, a gate electrode formed on an insulating film formed on a surface of a semiconductor substrate must be decreased in dimension. Consequently, there arises a problem that dimensional accuracy becomes poor when the dimension of the gate electrode is made small.

SUMMARY OF THE INVENTION

An object of the present invention is to provide a fine semiconductor device and a manufacturing method thereof.

A manufacturing method of a semiconductor device according to one aspect of the present invention includes a first electrode formation step of forming a first electrode above a surface of a semiconductor substrate with a first insulating film interposed between the first electrode and the semiconductor substrate, a charge accumulation film formation step of forming a charge accumulation film beside the first electrode at least on the surface of the semiconductor substrate, and a second electrode formation step of forming a second electrode on a surface of the charge accumulation film. Herein, the second electrode formation step includes a step of forming a second electrode layer on the surface of the charge accumulation film, a step of forming an auxiliary film, having an etching rate slower than that of the second electrode layer, on a surface of the second electrode layer, and a step of performing anisotropic etching on the second electrode layer and the auxiliary film, thereby forming the second electrode.

A manufacturing method of a semiconductor device according to another aspect of the present invention includes a step of forming a dummy film having a side face on a surface of a semiconductor substrate, a step of forming a first insulating film on the surface of the semiconductor substrate, a step of forming a gate electrode layer on a surface of the first insulating film and a surface of the dummy film, a step of forming an auxiliary film, having an etching rate slower than that of the gate electrode layer, on a surface of the gate electrode layer, a step of performing anisotropic etching on the gate electrode layer and the auxiliary film, thereby forming a gate electrode, a step of removing the dummy film, and a step of removing a portion corresponding to a region outside the gate electrode in the first insulating film.

A semiconductor device according to one aspect of the present invention includes a first electrode provided above a surface of a semiconductor substrate with a first insulating film interposed between the first electrode and the semiconductor substrate, a charge accumulation film formed beside the first electrode on the surface of the semiconductor substrate, a second electrode provided on a surface of the charge accumulation film, and a sidewall insulating film provided beside the second electrode. Herein, the second electrode is formed such that a surface facing to the first electrode is substantially parallel with a surface facing to the sidewall insulating film in a sectional shape thereof. Further, the second electrode is formed such that a top face is recessed in the sectional shape thereof.

A semiconductor device according to another aspect of the present invention includes a gate electrode provided above a surface of a semiconductor substrate with a first insulating film interposed between the gate electrode and the semiconductor substrate, and sidewall insulating films formed on both left and right sides of the gate electrode in a sectional shape. Herein, the gate electrode is formed such that left and right surfaces facing to the sidewall insulating films are substantially parallel with each other in the sectional shape thereof. Further, the gate electrode is formed such that a top face is recessed in the sectional shape thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Description will be given of a semiconductor device according to a first embodiment of the present invention with reference to FIGS. 1 to 17. The semiconductor device according to this embodiment is an EEPROM, in particular, a nonvolatile memory having an ONO film serving as a charge accumulation film.

Figure 1:
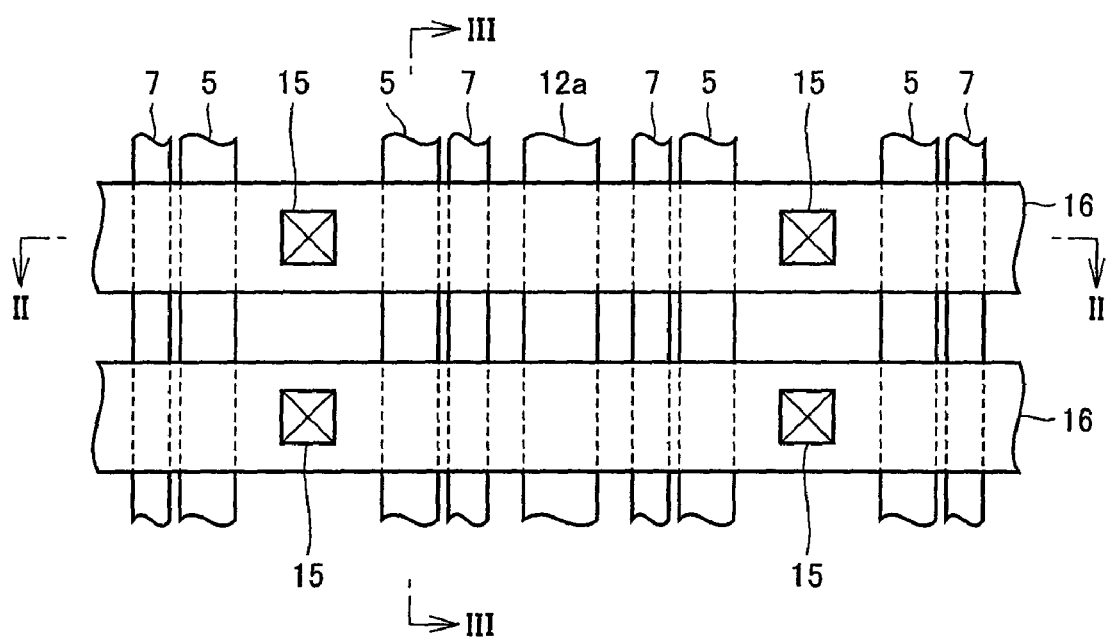
FIG. 1 is a first sectional view schematically illustrating a semiconductor device according to a first embodiment.
Figure 2:
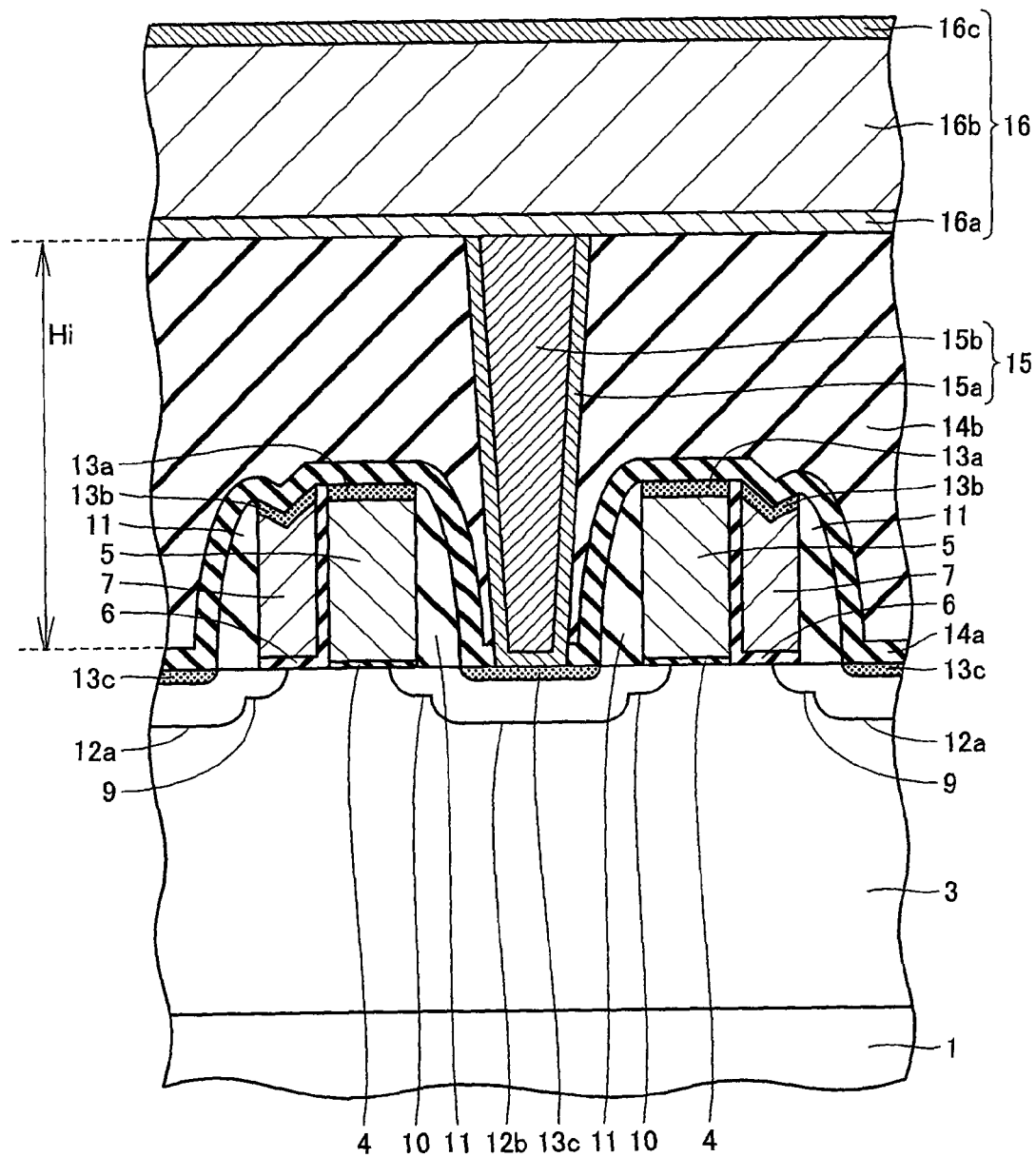
FIG. 2 is a second sectional view schematically illustrating the semiconductor device according to the first embodiment.
Figure 3:
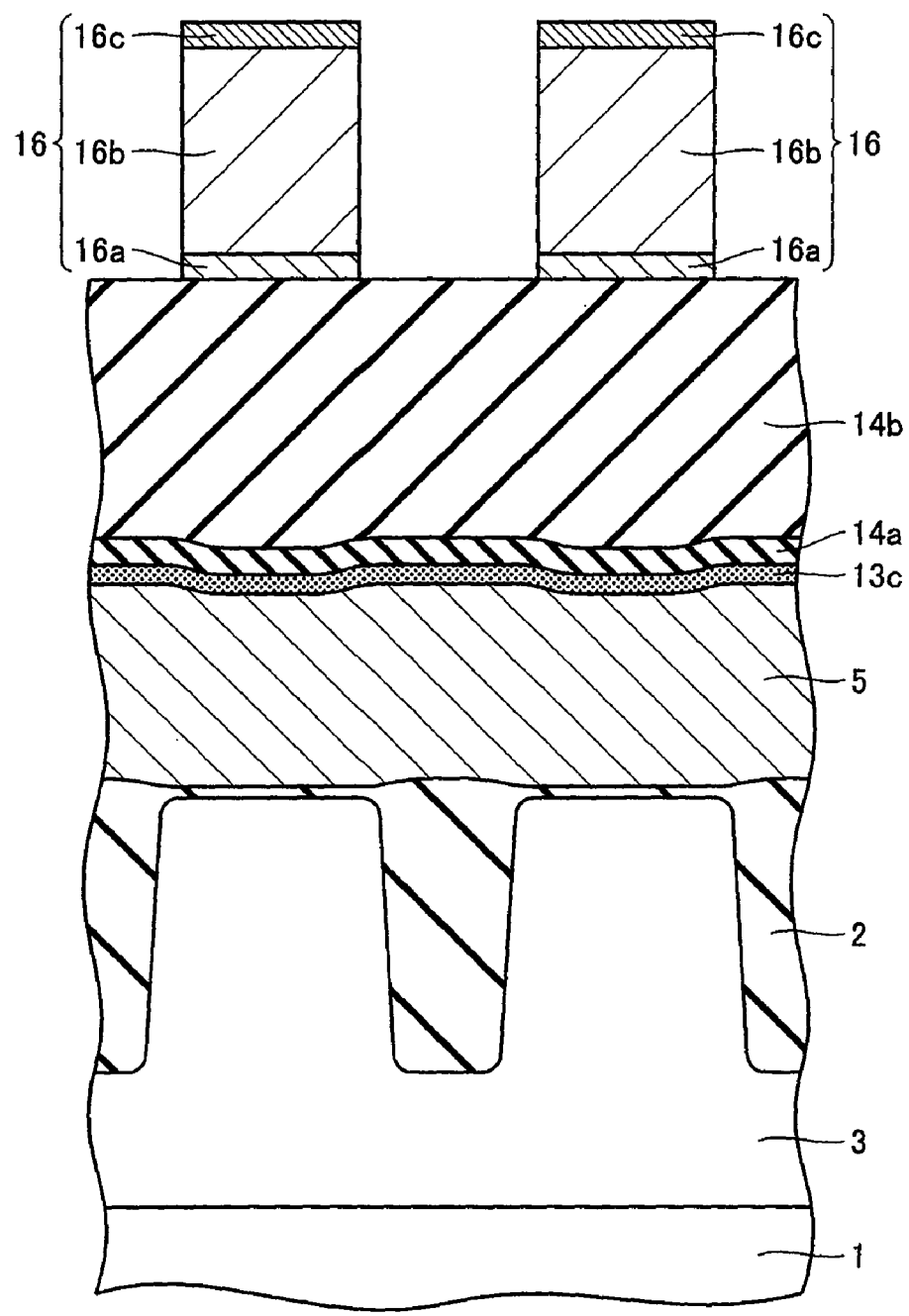
FIG. 3 is a third sectional view schematically illustrating the semiconductor device according to the first embodiment.

FIG. 1 is a sectional view schematically illustrating the semiconductor device according to this embodiment. FIG. 2 is a sectional view taken along a line II-II in FIG. 1. FIG. 3 is a sectional view taken along a line III-III in FIG. 1.

With reference to FIG. 1, the semiconductor device according to this embodiment includes control gate electrodes 5 and memory gate electrodes 7. Control gate electrode 5 and memory gate electrode 7 are formed so as to extend substantially in parallel with each other when being seen in a plane. Control gate electrode 5 and memory gate electrode 7 are formed in a pair. In a surface of a semiconductor substrate, a diffusion layer 12a is formed on a region located between one pair of control gate electrode 5 and memory gate electrode 7 and another pair of control gate electrode 5 and memory gate electrode 7. Moreover, an interlayer insulating film is formed on surfaces of control gate electrode 5 and memory gate electrode 7. Interconnections 16 are formed on a surface of the interlayer insulating film. Interconnection 16 in this embodiment is formed so as to extend in a direction perpendicular to a direction in which control gate electrode 5 and memory gate electrode 7 extend. On the interlayer insulating film, contacts 15 are formed for achieving electrical conduction from interconnections 16. Contact 15 is provided beside a pair of control gate electrode 5 and memory gate electrode 7.

With reference to FIG. 2, a memory well portion 3 is formed on a semiconductor substrate 1. In this embodiment, a silicon substrate is used as semiconductor substrate 1. FIG. 2 illustrates two memory cells (elements).

A control gate electrode 5 serving as a first electrode is formed above a surface of semiconductor substrate 1 with a control gate insulating film 4 serving as a first insulating film interposed between control gate electrode 5 and semiconductor substrate 1. A storage node insulating film 6 serving as a charge accumulation film is formed on the surface of semiconductor substrate 1, a side face of control gate electrode 5 and a side face of control gate insulating film 4. A memory gate electrode 7 serving as a second electrode is formed on a surface of storage node insulating film 6. As described above, one pair of a control gate electrode and a memory gate electrode and another pair of a control gate electrode and a memory gate electrode are provided on both sides of a contact 15 with insulating films interposed between the pairs and contact 15.

Sidewall insulating films 11 are formed on a side face of control gate electrode 5 and a side face of memory gate electrode 7. A silicide film 13a is formed on a top face of control gate electrode 5 and a silicide film 13b is formed on a top face of memory gate electrode 7. In this embodiment, a CoSi film is used as each of silicide films 13a and 13b.

A protection insulating film 14a is formed so as to surround control gate electrode 5, memory gate electrode 7 and sidewall insulating films 11. With regard to protection insulating film 14a in this embodiment, an $Si_3N_4$ film which is a nitride film is formed as a self aligned contact film.

An interlayer insulating film 14b is provided on a surface of protection insulating film 14a. Interlayer insulating film 14b is formed so as to entirely cover the two memory cells. Interlayer insulating film 14b has a planarized surface.

Contact 15 is formed so as to pass through protection insulating film 14a and interlayer insulating film 14b. Contact 15 includes conductive layers 15a and 15b. Conductive layer 15a is provided on a surface of a contact hole formed in interlayer insulating film 14b. Conductive layer 15b is provided inside conductive layer 15a. An interconnection 16 is formed on a surface of interlayer insulating film 14b. Interconnection 16 includes metal layers 16a to 16c. Metal layer 16a is electrically connected to contact 15.

On the surface of semiconductor substrate 1, an extension diffusion layer 9 is formed at a source side and an extension diffusion layer 10 is formed at a drain side. Impurities are injected into each of extension diffusion layers 9 and 10. Extension diffusion layer 9 is formed so as to extend from a bottom side of memory gate electrode 7 toward an outer side of the memory cell. Extension diffusion layer 10 is formed so as to extend from a bottom side of control gate electrode 5 toward an outer side of the element.

Diffusion layers 12a and 12b each having impurities injected thereinto so as to be higher in concentration than that of each of extension diffusion layers 9 and 10 are formed on the surface of semiconductor substrate 1. Diffusion layer 12a is formed so as to extend from a portion immediately below sidewall insulating film 11 provided on the side face of memory gate electrode 7 toward the outer side of the memory cell. Diffusion layer 12b is formed immediately below contact 15. Diffusion layer 12b is formed so as to extend from a bottom side of sidewall insulating film 11 provided on the side face of control gate electrode 5 toward the outer side of the memory cell. Diffusion layer 12b is formed so as to crosslink between the two memory cells. At a substantially center portion in a direction in which diffusion layers 12a and 12b extend, a silicide film 13c is formed for reducing electrical resistance. In this embodiment, a CoSi film is used as silicide film 13c. Contact 15 is electrically connected to silicide film 13c.

With reference to FIG. 3, an element isolation portion 2 is formed on memory well portion 3. Interlayer insulating film 14b has the planarized surface. Interconnections 16 in this embodiment are formed so as to extend in parallel with each other. Interconnection 16 is formed such that a sectional shape when being cut in a direction perpendicular to an extending direction is rectangular.

Figure 4:
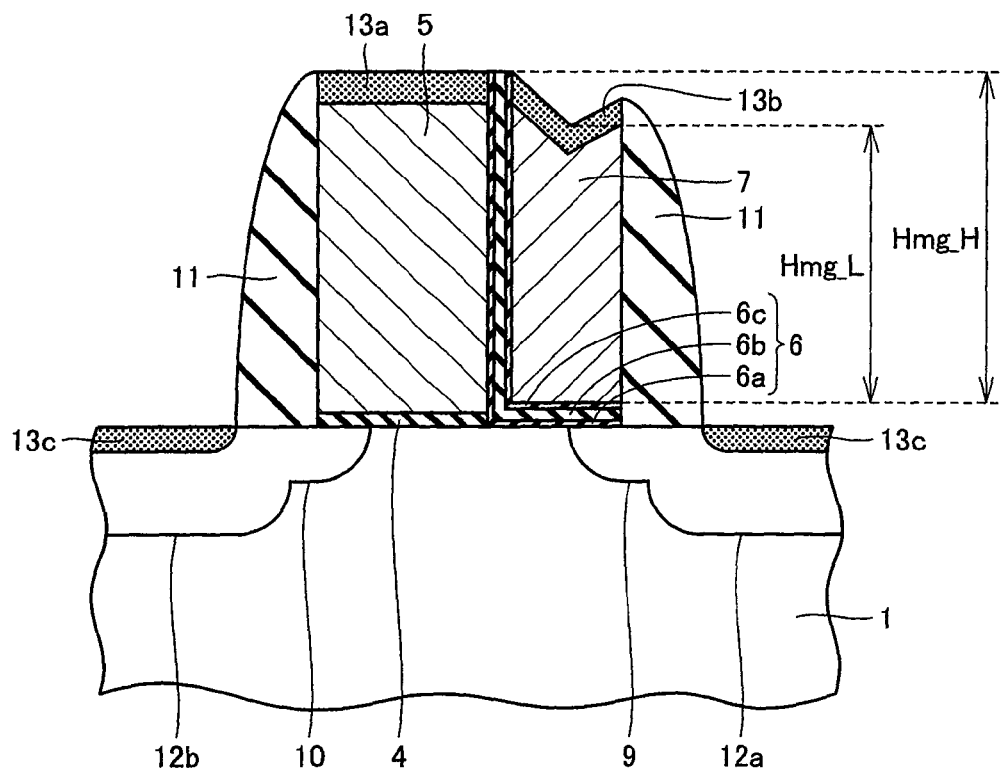
FIG. 4 is an enlarged sectional view schematically illustrating a memory cell in the first embodiment.

FIG. 4 is an enlarged sectional view schematically illustrating the memory cell as the element in this embodiment. In this embodiment, control gate insulating film 4 is formed on the surface of semiconductor substrate 1. Control gate electrode 5 is formed on the surface of control gate insulating film 4. In this embodiment, control gate electrode 5 is formed so as to have a rectangular sectional shape. Control gate electrode 5 is provided above the surface of the semiconductor substrate 1 with control gate insulating film 4 interposed between control gate electrode 5 and semiconductor substrate 1.

In this embodiment, storage node insulating film 6 serving as a charge accumulation film is an ONO film. Storage node insulating film 6 includes silicon oxide films 6a and 6c and an silicon nitride film 6b. Storage node insulating film 6 is provided on the surface of semiconductor substrate 1, one of the side faces of control gate electrode 5 and one of the side faces of control gate insulating film 4. Storage node insulating film 6 is formed so as to have an "L"-shaped sectional shape. Storage node insulating film 6 includes a portion interposed between semiconductor substrate 1 and memory gate electrode 7.

Sidewall insulating film 11 is formed on the other one of the side faces of control gate electrode 5 and the other one of the side faces of control gate insulating film 4. Sidewall insulating film 11 is formed on the side face of memory gate electrode 7 and a side face of storage node insulating film 6.

Memory gate electrode 7 is formed such that a surface facing to control gate electrode 5 is substantially parallel with a surface facing to sidewall insulating film 11 in a sectional shape thereof. More specifically, in this embodiment, memory gate electrode 7 is formed such that a width is substantially constant in a height direction in the sectional shape thereof.

Memory gate electrode 7 is formed such that a substantially center portion of a top face is recessed in a width direction in the sectional shape thereof. Memory gate electrode 7 is formed so as to have a section in a direction perpendicular to an extending direction such that a center portion of a top face is recessed. Memory gate electrode 7 is formed such that the top face is formed into a substantially "V" shape in the sectional shape thereof.

In a height of memory gate electrode 7, it is assumed herein that a maximum height is Hmg_H and a minimum height is Hmg_L. In a case that impurities are injected into semiconductor substrate 1 in an ion implantation step of forming diffusion layer 12a in a manufacturing process, minimum height Hmg_L is set such that the impurities are prevented from reaching storage node insulating film 6. In other words, in the ion implantation step of forming diffusion layer 12a, memory gate electrode 7 has a sufficient height such that impurities are prevented from reaching storage node insulating film 6.

The semiconductor device according to this embodiment has a small difference between maximum height Hmg_H and minimum height Hmg_L; therefore, maximum height Hmg_H can be made low. In other words, the height of memory gate electrode 7 can be made low, and the height of the interlayer insulating film provided on the memory cell can be made low as a whole. In FIG. 2, a height Hi of interlayer insulating film 14b can be made low. As a result, a depth of a contact hole for forming contact 15 can be made shallow. For example, even in a fine semiconductor device below a 90 nm rule, a contact hole can be formed with high reliability.

Figure 5:
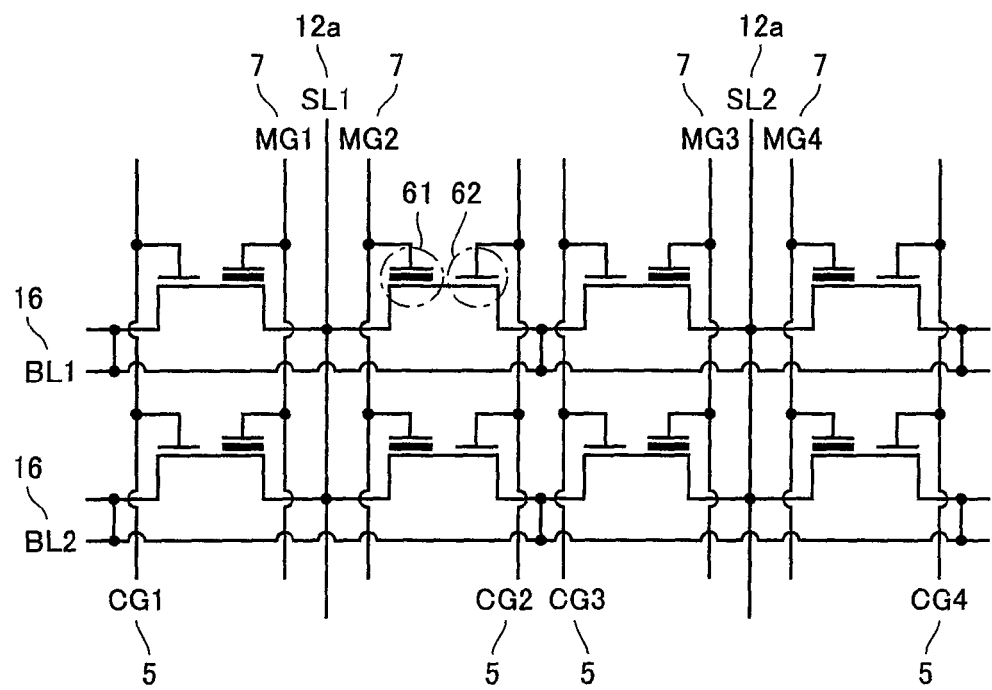
FIG. 5 is a circuit diagram illustrating the semiconductor device according to the first embodiment.
Figures 6, 7:
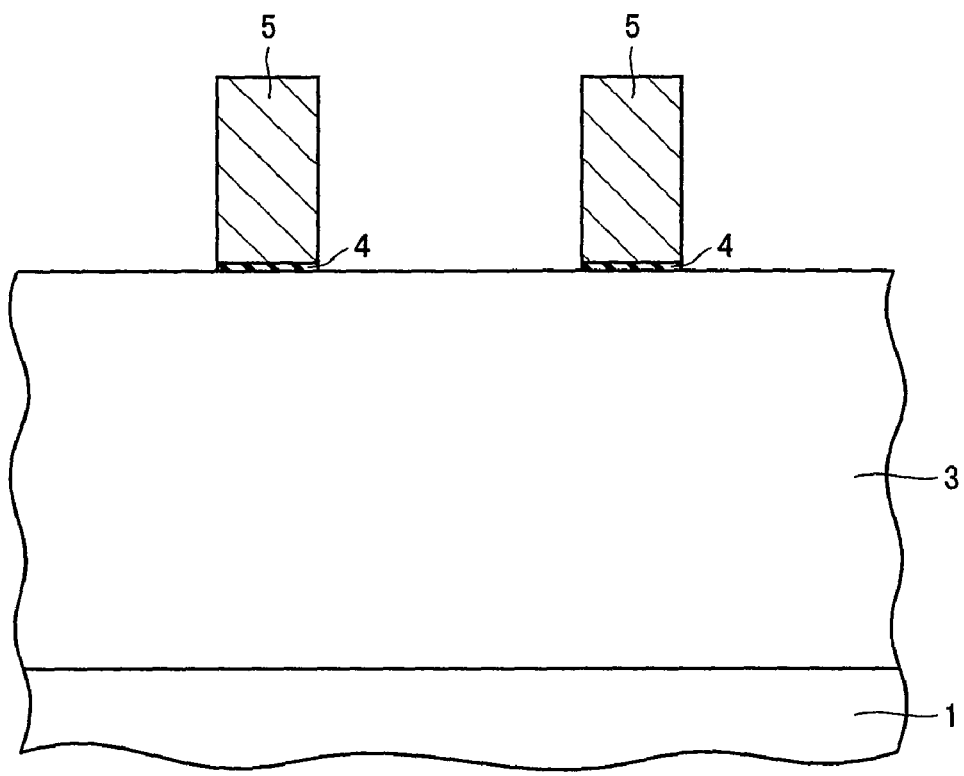
FIG. 6 is table showing a voltage applied for driving the semiconductor device according to the first embodiment.
FIG. 7 illustrates a first step in a manufacturing method of the semiconductor device according to the first embodiment.

FIG. 5 is a circuit diagram illustrating the semiconductor device according to this embodiment. FIG. 6 is a table showing a voltage applied for driving the semiconductor device according to this embodiment.

In FIG. 5, "MG1" to "MG4" denote lines of memory gate electrode 7. "CG1" to "CG4" denote lines of control gate electrode 5. "BL1" and "BL2" denote interconnections 16 formed on the surface of the interlayer insulating film (see FIGS. 1 to 3). "SL1" and "SL2" denote diffusion layers 12a. A region 61 denotes a portion including memory gate electrode 7 and storage node insulating film 6. A region 62 denotes a portion including control gate electrode 5 and control gate insulating film 4.

With reference to FIG. 6, operations of the semiconductor device according to this embodiment include a read operation, a write operation and an erase operation. In FIG. 6, "Vmg" denotes a voltage of a memory gate electrode, "Vs" denotes a voltage of a diffusion layer at a source side, "Vcg" denotes a voltage of a control gate electrode, and "Vd" denotes a voltage of a diffusion layer at a drain side. Also in FIG. 6, "Vsub" denotes a voltage of a semiconductor substrate.

In the write operation of the semiconductor device according to this embodiment, a positive voltage is applied to a memory gate electrode and a diffusion layer at a source side, respectively, by source-side injection. A small positive voltage is applied to a control gate electrode. Electrons travel toward the source side along a main surface of semiconductor substrate 1. When the electrons collide with an extension diffusion layer at the source side, hot electrons are generated. The generated hot electrons are attracted to the voltage of the control gate electrode and are accumulated on an silicon nitride film in a storage node insulating film.

In the erase operation of the semiconductor device according to this embodiment, hot hole injection by an interband tunnel is adopted. A negative voltage is applied to a memory gate electrode. A positive electrode, that is, a reverse bias, is applied to a diffusion layer at a source side. A strong electric field at an end of an extension diffusion layer at the source side generates hot holes by an interband tunnel. The hot holes are injected into an silicon nitride film of a storage node insulating film and, then, are coupled to electrons; thus, the electrons are erased.

In the read operation of the semiconductor device according to this embodiment, a positive voltage is applied to a memory gate electrode and a control gate electrode, respectively. Further, a positive voltage is applied to a diffusion layer at a drain side. Herein, it is determined whether or not is information is recorded, based on magnitude of a current flowing into the diffusion layer at the drain side.

Next, description will be given of a manufacturing method of the semiconductor device according to this embodiment with reference to FIGS. 7 to 16.

FIG. 7 is a sectional view schematically illustrating a first step in the manufacturing method of the semiconductor device according to this embodiment. First, ions are implanted into a surface of a semiconductor substrate 1, so that a memory well portion 3 is formed.

Next, a first electrode formation step is carried out for forming a first electrode above the surface of the semiconductor substrate with a first insulating film interposed between the first electrode and the semiconductor substrate. For example, a thermal oxidation film is formed as a layer corresponding to a control gate insulating film 4 on the surface of semiconductor substrate 1. Further, a polysilicon layer is formed as a layer corresponding to a control gate electrode 5 on a surface of the layer corresponding to control gate insulating film 4. Thereafter, patterning is performed by photolithography, so that control gate insulating film 4 is formed as a first insulating film. In addition, control gate electrode 5 is formed as the first electrode having a substantially square sectional shape.

Figure 8:
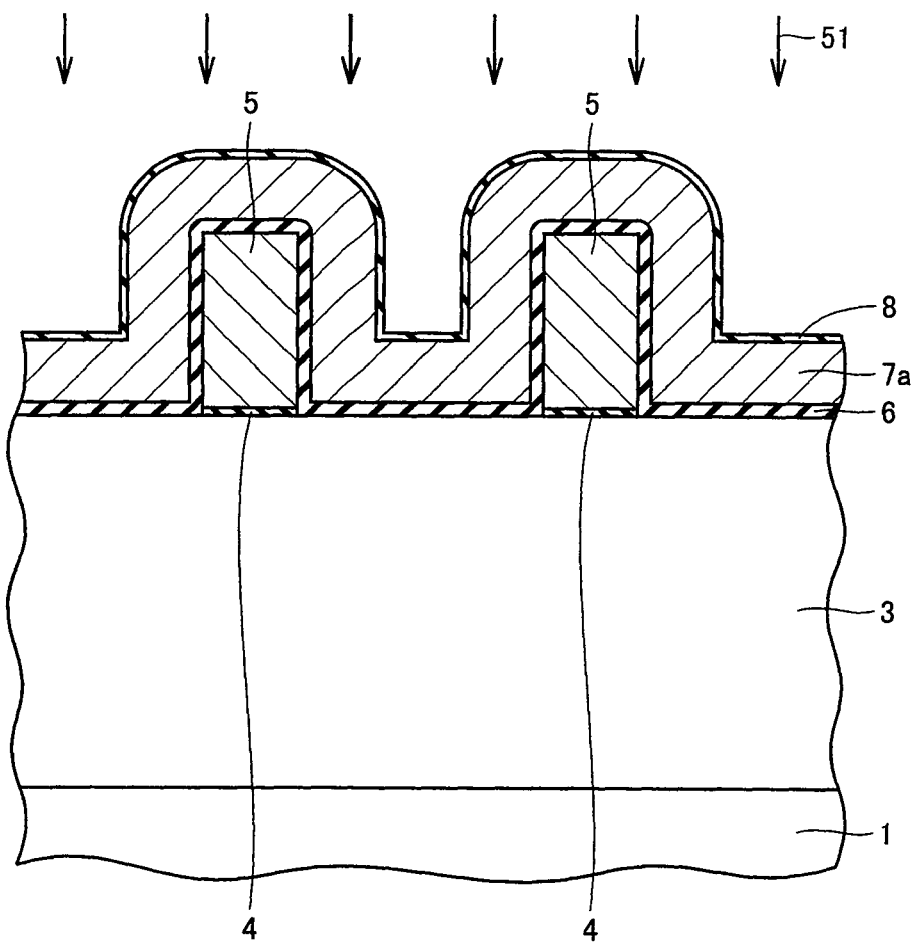
FIG. 8 illustrates a second step in the manufacturing method of the semiconductor device according to the first embodiment.

FIG. 8 is a sectional view schematically illustrating a second step in the manufacturing method of the semiconductor device according to this embodiment. Next, a charge accumulation film formation step is carried out for forming a charge accumulation film. A storage node insulating film 6 serving as a charge accumulation film is formed on the surface of semiconductor substrate 1, a side face of control gate insulating film 4 and a surface of control gate electrode 5. Storage node insulating film 6 is formed on at least a portion beside control gate electrode 5 on the surface of semiconductor substrate 1. In this embodiment, an ONO film including three layers: an $SiO_2$ film, an $Si_3N_4$ film and an $SiO_2$ film is used as storage node insulating film 6 (see FIG. 4).

Next, a second electrode formation step is carried out for forming a memory gate electrode serving as a second electrode on a surface of the charge accumulation film. A memory gate electrode layer 7a serving as a second electrode layer is provided on the surface of storage node insulating film 6. The second electrode layer is formed so as to cover storage node insulating film 6. In this embodiment, an amorphous silicon film doped with impurities is laminated as memory gate electrode layer 7a.

Next, an auxiliary film 8 is formed on a surface of memory gate electrode layer 7a. Auxiliary film 8 is slower in a rate of etching performed in a later step than that of memory gate electrode layer 7a. In this embodiment, a silicon oxide film is formed as auxiliary film 8. The silicon oxide film can be formed in such a manner that the surface of memory gate electrode layer 7a is subjected to thermal oxidation. This thermal oxidation of the surface of memory gate electrode layer 7a facilitates control of auxiliary film 8 in thickness. The method of forming the silicon oxide film is not limited to the aforementioned method. The silicon oxide film may be formed in such a manner that an silicon oxide film is laminated on the surface of memory gate electrode layer 7a.

An auxiliary film is not limited to the aforementioned auxiliary film as long as it has an etching rate slower than that of a memory gate electrode layer in anisotropic etching performed in a later step. In this embodiment, for example, a nitride film may be formed as the auxiliary film.

Preferably, the auxiliary film is a film having a selectivity ratio between memory gate electrode layer 7a and auxiliary film 8 of substantially 10:1, in consideration of optimal etching in a later step of performing anisotropic etching.

Next, anisotropic etching is performed as shown by an arrow 51. In auxiliary film 8, a portion provided substantially in a horizontal direction is preferentially subjected to etching.

Figure 9:
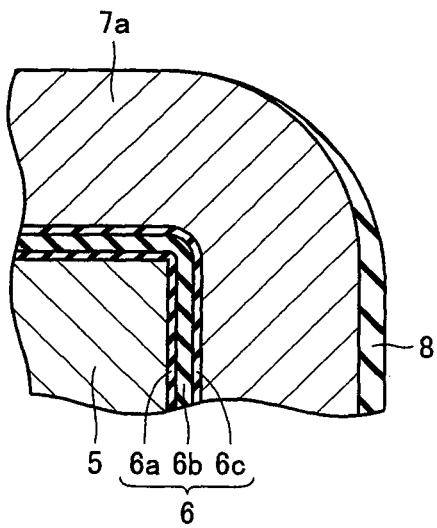
FIG. 9 is a first enlarged sectional view schematically illustrating a case of performing anisotropic etching in the manufacturing method of the semiconductor device according to the first embodiment.

FIG. 9 is an enlarged sectional view schematically illustrating an upper portion of a control gate electrode subjected to anisotropic etching. By performance of the anisotropic etching, first, the portion extending in the horizontal direction is removed in auxiliary film 8, so that memory gate electrode layer 7a is subjected to etching. At a top side of control gate electrode 5, an upper portion of memory gate electrode layer 7a is subjected to etching.

Figure 10:
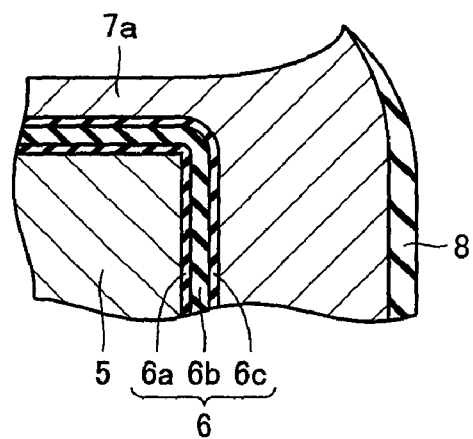
FIG. 10 is a second enlarged sectional view schematically illustrating a case of performing anisotropic etching in the manufacturing method of the semiconductor device according to the first embodiment.

FIG. 10 is an enlarged sectional view schematically illustrating the upper portion of the control gate electrode further subjected to anisotropic etching continuously. Since an etching rate of auxiliary film 8 is slower than that of memory gate electrode layer 7a, memory gate electrode layer 7a is preferentially removed. More specifically, since the etching rate of auxiliary film 8 is slow, most of auxiliary film 8 is remained and most of memory gate electrode layer 7a is removed. Memory gate electrode layer 7a is subjected to etching at a portion away from auxiliary film 8 rather than a portion near auxiliary film 8. The anisotropic etching is continuously performed until memory gate electrode layer 7a provided on control gate electrode 5 is removed.

Figure 11:
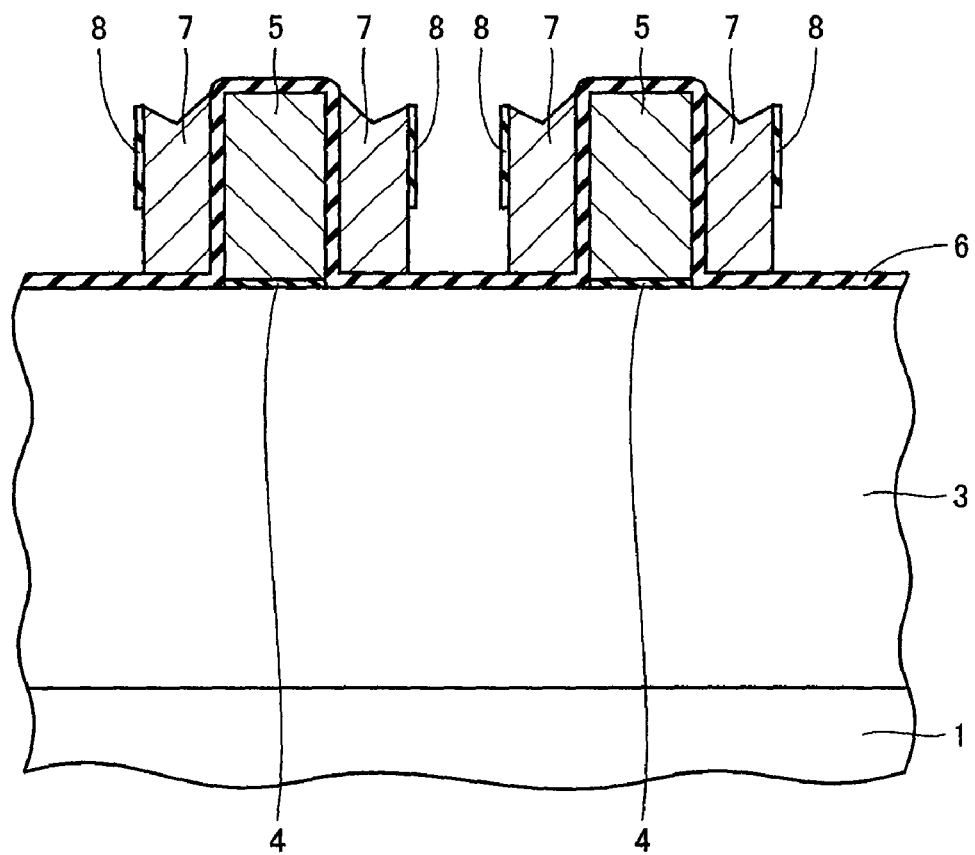
FIG. 11 illustrates a third step in the manufacturing method of the semiconductor device according to the first embodiment.

FIG. 11 is a sectional view schematically illustrating a third step in the manufacturing method of the semiconductor device according to this embodiment. FIG. 11 is a sectional view schematically illustrating a state after completion of anisotropic etching. Memory gate electrode layer 7a is partially removed; thus, a memory gate electrode 7 is formed. Memory gate electrode 7 is formed such that a thickness in a width direction becomes substantially constant in a height direction. A top face of memory gate electrode 7 is formed such that a substantially center portion of memory gate electrode 7 is recessed in a width direction. In this embodiment, the top face of memory gate electrode 7 is formed into a substantially "V" shape. Auxiliary film 8 is partially remained on a side face of memory gate electrode 7.

Figure 12:
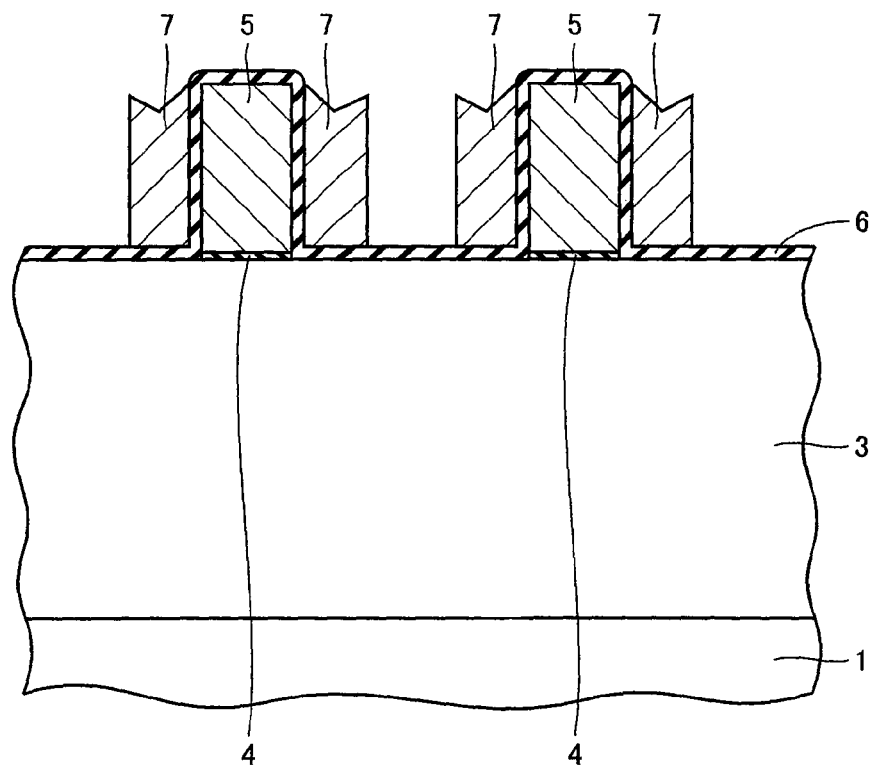
FIG. 12 illustrates a fourth step in the manufacturing method of the semiconductor device according to the first embodiment.

FIG. 12 is a sectional view schematically illustrating a fourth step in the manufacturing method of the semiconductor device according to this embodiment. By performance of isotropic etching such as wet etching, auxiliary film 8 remained on the side face of memory gate electrode 7 is removed.

Figure 13:
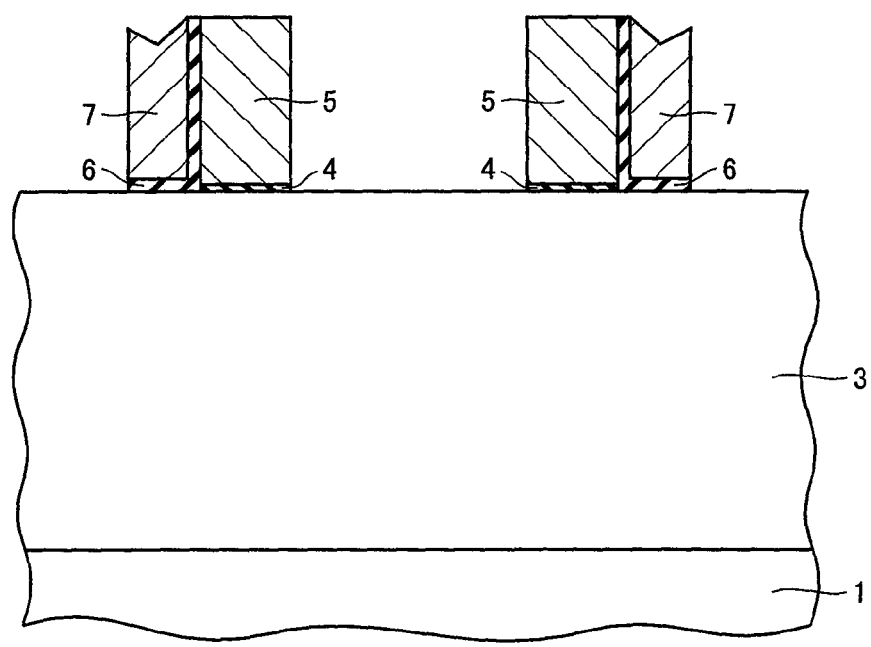
FIG. 13 illustrates a fifth step in the manufacturing method of the semiconductor device according to the first embodiment.

FIG. 13 is a sectional view schematically illustrating a fifth step in the manufacturing method of the semiconductor device according to this embodiment. One of memory gate electrodes 7 provided on the both sides of control gate electrode 5 is removed. In this embodiment, a mask is provided on the surface of control gate electrode 5 by photolithography to remove one of memory gate electrodes 7. Further, isotropic etching such as wet etching is performed for removing a portion other than a portion interposed between memory gate electrode 7 and control gate electrode 5 and a portion interposed between semiconductor substrate 1 and memory gate electrode 7 in storage node insulating film 6. Storage node insulating film 6 is formed so as to have an "L"-shaped sectional shape.

Figure 14:
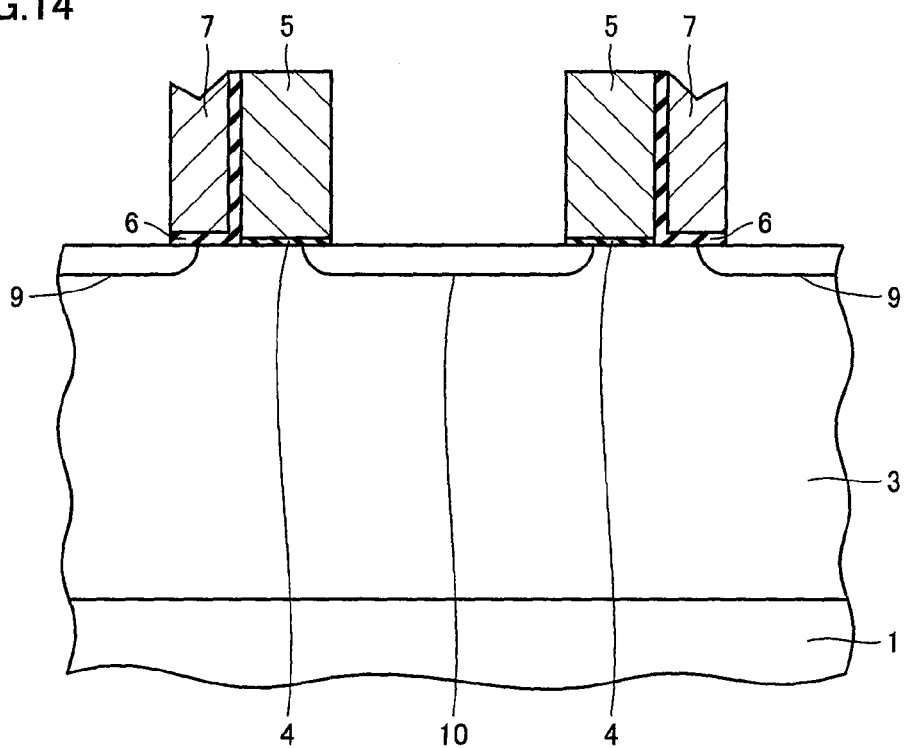
FIG. 14 illustrates a sixth step in the manufacturing method of the semiconductor device according to the first embodiment.

FIG. 14 is a sectional view schematically illustrating a sixth step in the manufacturing method of the semiconductor device according to this embodiment. Next, ions are implanted into semiconductor substrate 1 in a self aligned manner while using each of control gate electrode 5 and memory gate electrode 7 as a mask. By performance of this ion implantation, an extension diffusion layer 9 at a source side and an extension diffusion layer 10 at a drain side are formed. With regard to this ion implantation, for example, arsenic is implanted at $2 \times 10^{15}$ atoms/cm$^2$ with an energy of 5 kev.

Figure 15:
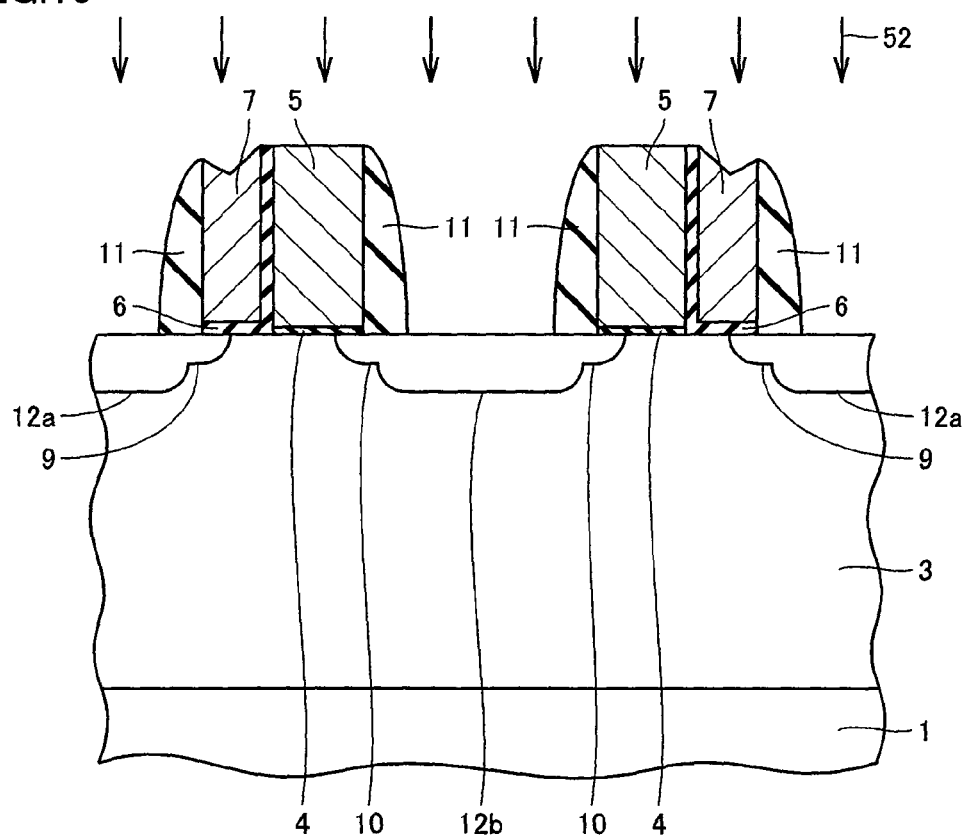
FIG. 15 illustrates a seventh step in the manufacturing method of the semiconductor device according to the first embodiment.

FIG. 15 is a sectional view schematically illustrating a seventh step in the manufacturing method of the semiconductor device according to this embodiment. Next, sidewall insulating films 11 are formed on the side face of control gate electrode 5 and the side face of memory gate electrode 7.

Next, as shown by an arrow 52, ions are implanted into semiconductor substrate 1 in a self aligned manner while using each of control gate electrode 5, memory gate electrode 7 and sidewall insulating film 11 as a mask. By performance of this ion implantation, a diffusion layer 12a at the source side and a diffusion layer 12b at the drain side are formed. With regard to this ion implantation, for example, arsenic is injected at $2 \times 10^{15}$ atoms/cm$^2$ with an energy of 50 kev and phosphorus is injected at $1 \times 10^{13}$ atoms/cm$^2$ with an energy of 40 kev.

In the manufacturing method of the semiconductor device according to this embodiment, a minimum height of memory gate electrode 7 is high in a width direction upon implantation of ions with high energy. Therefore, it is possible to suppress that implanted ions transmit through memory gate electrode 7 to reach the portion interposed between semiconductor substrate 1 and memory gate electrode 7 in storage node insulating film 6.

Figure 16:
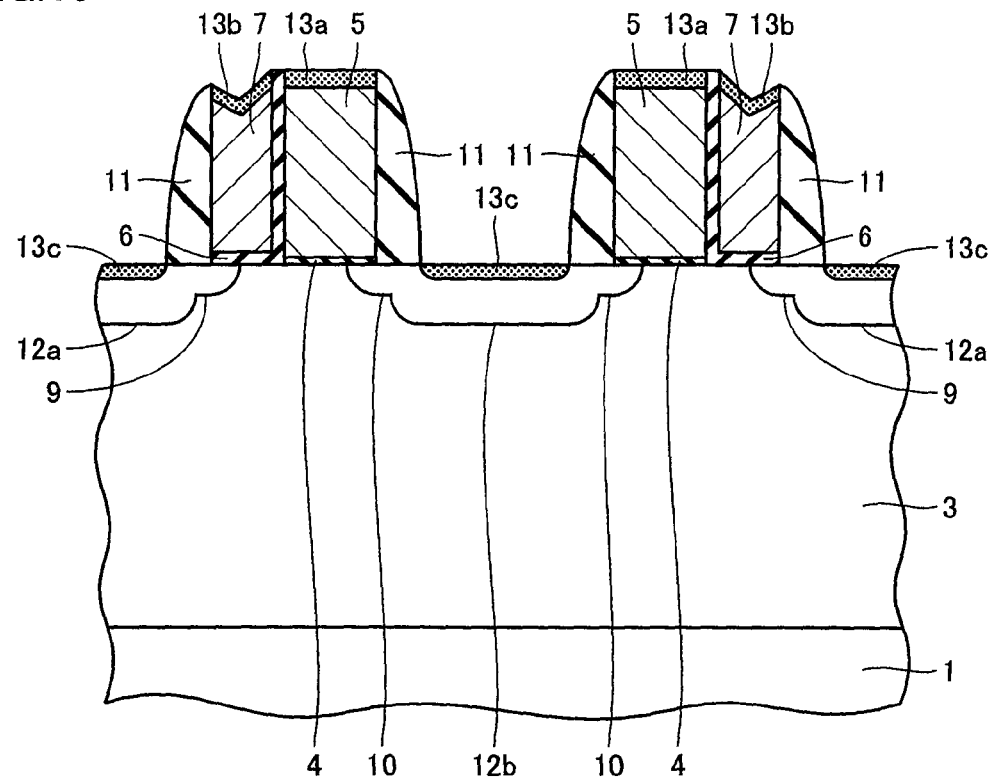
FIG. 16 illustrates an eighth step in the manufacturing method of the semiconductor device according to the first embodiment.

FIG. 16 is a sectional view schematically illustrating an eighth step in the manufacturing method of the semiconductor device according to this embodiment. Silicide films 13c are formed on surfaces of diffusion layers 12a and 12b on semiconductor substrate 1. Upon formation of silicide film 13c, for example, a cobalt film is deposited on the main surface of semiconductor substrate 1 and, then, cobalt is reacted with silicon by heat treatment. Thereafter, when the cobalt film is removed, a silicide film can be formed. Silicide film 13c is formed on the main surface of semiconductor substrate 1 and, concurrently, a silicide film 13a is formed on the top face of control gate electrode 5 and a silicide film 13b is formed on the top face of memory gate electrode 7.

With reference to FIG. 2, next, a protection insulating film 14a is formed so as to cover control gate electrode 5, memory gate electrode 7 and sidewall insulating film 11. In this embodiment, an $Si_3N_4$ film is formed as protection insulating film 14a.

Next, an interlayer insulating film 14b is provided on a surface of protection insulating film 14a. Next, for example, a resist is provided onto a surface of interlayer insulating film 14b to perform patterning for forming a contact hole by photolithography. Next, a contact hole is formed in interlayer insulating film 14b by etching. In this embodiment, a height of a memory cell can be made low; therefore, an entire thickness Hi of interlayer insulating film 14b can be made small. Accordingly, in a step of forming a semiconductor circuit in accordance with a 90 nm rule, for example, an ArF light source is used as a light source for exposure of a resist. Even when the resist is thin in the surface of interlayer insulating film 14b, a contact hole passing through the interlayer insulating film can be formed securely.

Conductive layers 15a and 15b are laminated on a surface of the formed contact hole; thus, a contact 15 is formed. Next, a surface of interlayer insulating film 14b is planarized by, for example, CMP (Chemical Mechanical Polishing). Next, an interconnection 16 including metal layers 16a to 16c is formed on the surface of the interlayer insulating film 14b.

The semiconductor device according to this embodiment can be manufactured as described above. The manufacturing method of the semiconductor device according to this embodiment includes a second electrode formation step of forming a memory gate electrode serving as a second electrode. The second electrode formation step includes a step of forming an auxiliary film having an etching rate slower than that of a memory gate electrode, and a step of performing anisotropic etching on the second electrode layer and the auxiliary film. According to this method, a substantially center portion of a top face of the memory gate electrode can be recessed; thus, a memory cell to be formed can be made low in height.

Figure 17:
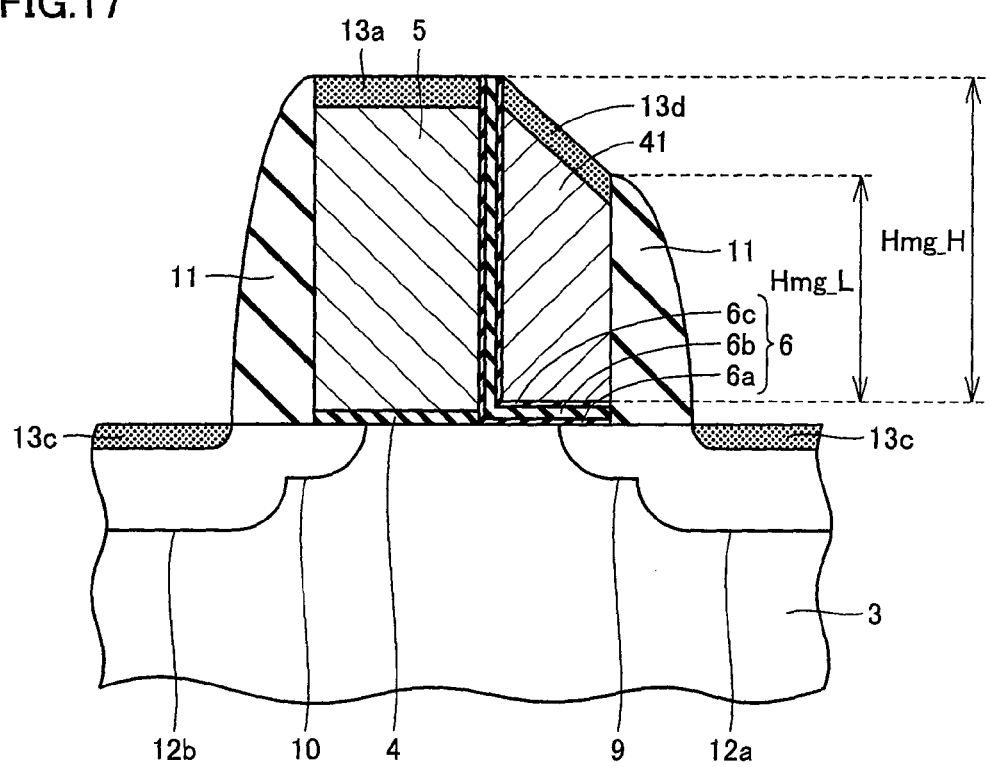
FIG. 17 is an enlarged sectional view schematically illustrating a comparative example of the memory cell in the semiconductor device according to the first embodiment.

FIG. 17 is a sectional view schematically illustrating a comparative example of the semiconductor device according to this embodiment. The semiconductor device in the comparative example is manufactured as follows. That is, in the second electrode formation step in this embodiment, no auxiliary film is formed on the surface of the second electrode layer.

In a step of performing anisotropic etching for forming a memory gate electrode 41 (see FIG. 8), a top face of memory gate electrode 41 is removed at an outer side thereof frequently rather than an inner side thereof. As a result, memory gate electrode 41 has a sectional shape in which the top plane face is inclined.

As for the semiconductor device in the comparative example, memory gate electrode 41 has a large difference between a maximum height Hmg_H and a minimum height Hmg_L. Herein, in a case that the height of memory gate electrode 41 is made low in order to finely manufacture the semiconductor device, minimum height Hmg_L becomes disadvantageously low, so that ions to be implanted reach storage node insulating film 6 in a later ion implantation step of forming a diffusion layer. Hence, it is difficult to finely manufacture the semiconductor device.

In this embodiment, however, a difference between a minimum height and a maximum height in a memory gate electrode can be made small, and the maximum height of the memory gate electrode can be made low. As a result, a thickness of an interlayer insulating film can be made thin, so that a contact hole can be formed securely. That is, a semiconductor device can be manufactured finely in this embodiment.

In the manufacturing method of the semiconductor device according to this embodiment, further, an auxiliary film is remained on a side face of a memory gate electrode in a second electrode formation step. Therefore, it is possible to prevent etching from being performed on the memory gate electrode in a width direction, and to form a memory gate electrode excellent in dimensional accuracy in a width direction. Accordingly, it is possible to manufacture a semiconductor device having a memory gate electrode small in width.

In this embodiment, as described above, it is possible to manufacture a fine semiconductor device or to make an allowance (process margin) upon manufacturing of a semiconductor device large.

The present invention is not only applicable to a memory cell having a MONOS structure, but also applicable to a memory cell having a SONOS structure.

Second Embodiment

Description will be given of a semiconductor device according to a second embodiment of the present invention with reference to FIGS. 18 to 25. The semiconductor device according to this embodiment is a so-called two-bit/cell nonvolatile memory in which memory gate electrodes are formed on both sides of a control gate electrode.

Figure 18:
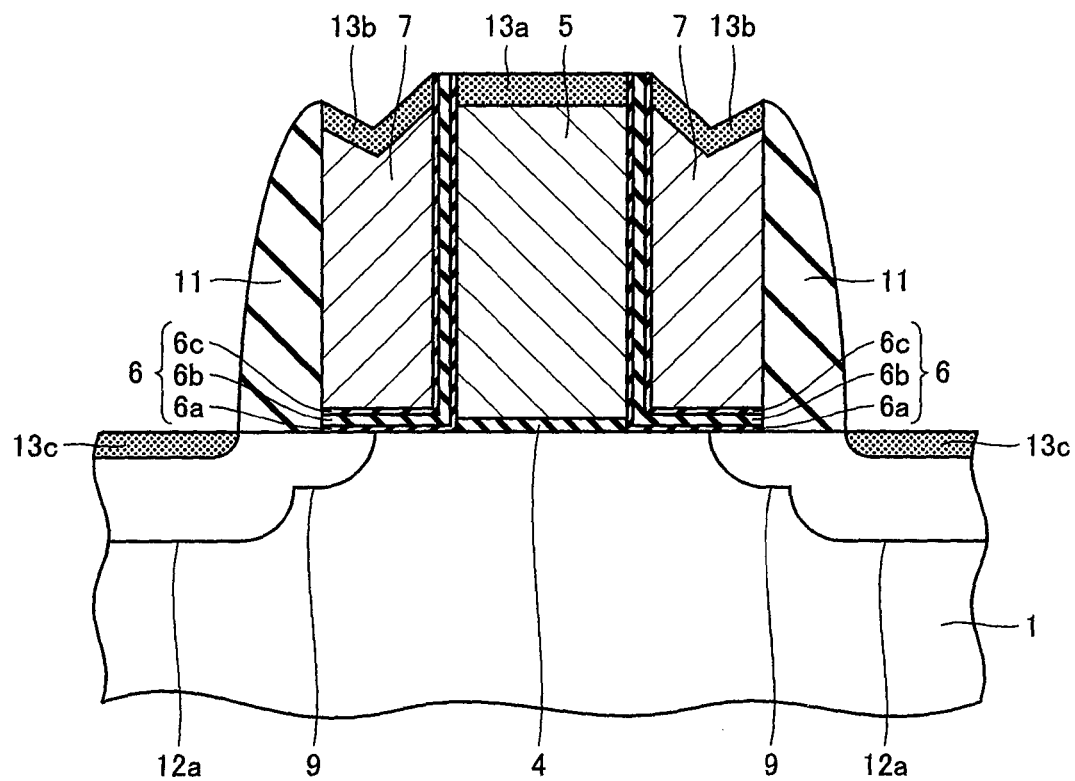
FIG. 18 is an enlarged sectional view schematically illustrating a memory cell in a semiconductor device according to a second embodiment.

FIG. 18 is a sectional view schematically illustrating the semiconductor device according to this embodiment. The semiconductor device according to this embodiment includes a control gate electrode 5 serving as a first electrode and memory gate electrodes 7 each serving as a second electrode. Herein, memory gate electrodes 7 are formed on both sides of control gate electrode 5.

An extension diffusion layer 9 and a diffusion layer 12a are formed on a surface of a semiconductor substrate 1. Extension diffusion layer 9 is formed so as to extend from a bottom side of memory gate electrode 7 toward an outer side of a memory cell. Control gate electrode 5 is provided above the surface of semiconductor substrate 1 with a control gate insulating film 4 serving as a first insulating film interposed between control gate electrode 5 and semiconductor substrate 1.

Storage node insulating films 6 each serving as a charge accumulation film are formed so as to extend from a side face of control gate electrode 5 toward a top face of semiconductor substrate 1. In this embodiment, storage node insulating film 6 is formed so as to have an "L"-shaped sectional shape. Herein, storage node insulating films 6 are formed on the both sides of control gate electrode 5.

Memory gate electrode 7 is formed on a surface of storage node insulating film 6. Storage node insulating film 6 is interposed between memory gate electrode 7 and semiconductor substrate 1. Storage node insulating film 6 is interposed between memory gate electrode 7 and control gate electrode 5. Each memory gate electrode 7 is formed such that a surface facing to control gate electrode 5 is substantially parallel with a surface facing to a sidewall insulating film 11. Memory gate electrode 7 is formed such that a width is substantially constant in a height direction in a sectional shape thereof. Each memory gate electrode 7 is formed so as to have a top face in which a center portion is recessed in a width direction.

Description will be given of a manufacturing method of the semiconductor device according to this embodiment with reference to FIGS. 19 to 25.

Figure 19:
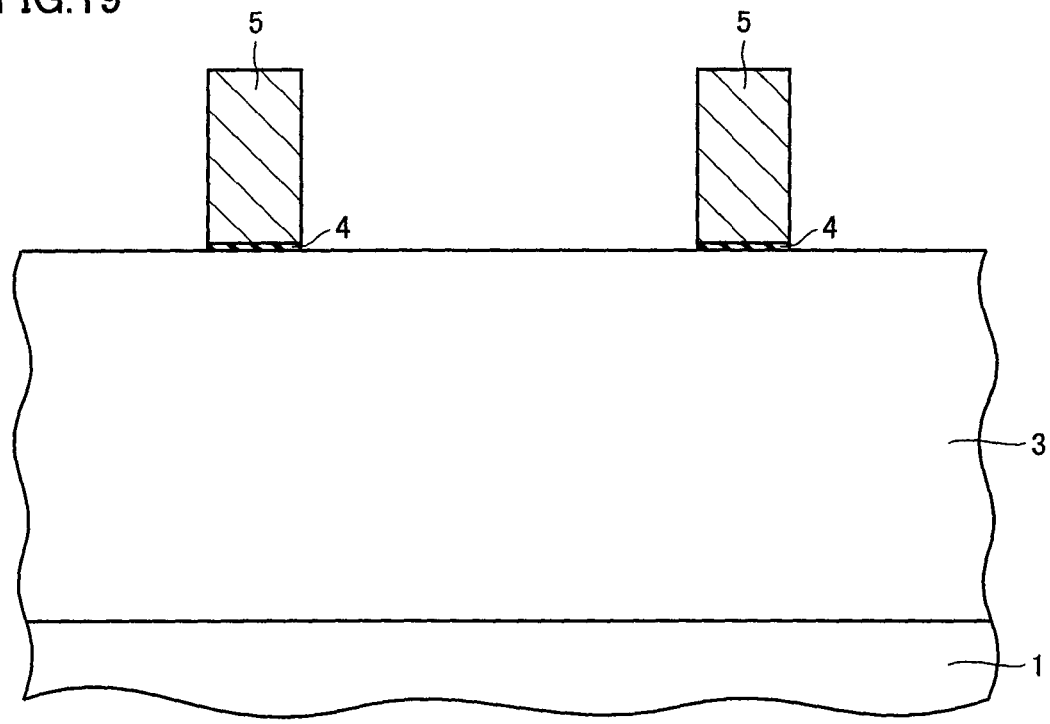
FIG. 19 illustrates a first step in a manufacturing method of the semiconductor device according to the second embodiment.

FIG. 19 is a sectional view schematically illustrating a first step in the manufacturing method of the semiconductor device according to this embodiment. First, a memory well portion 3 is formed on a semiconductor substrate 1. Next, a first electrode formation step is carried out for forming a first electrode above a surface of semiconductor substrate 1. More specifically, a control gate insulating film 4 serving as a first insulating film and a control gate electrode 5 serving as a first electrode are formed on the surface of semiconductor substrate 1.

Figure 20:
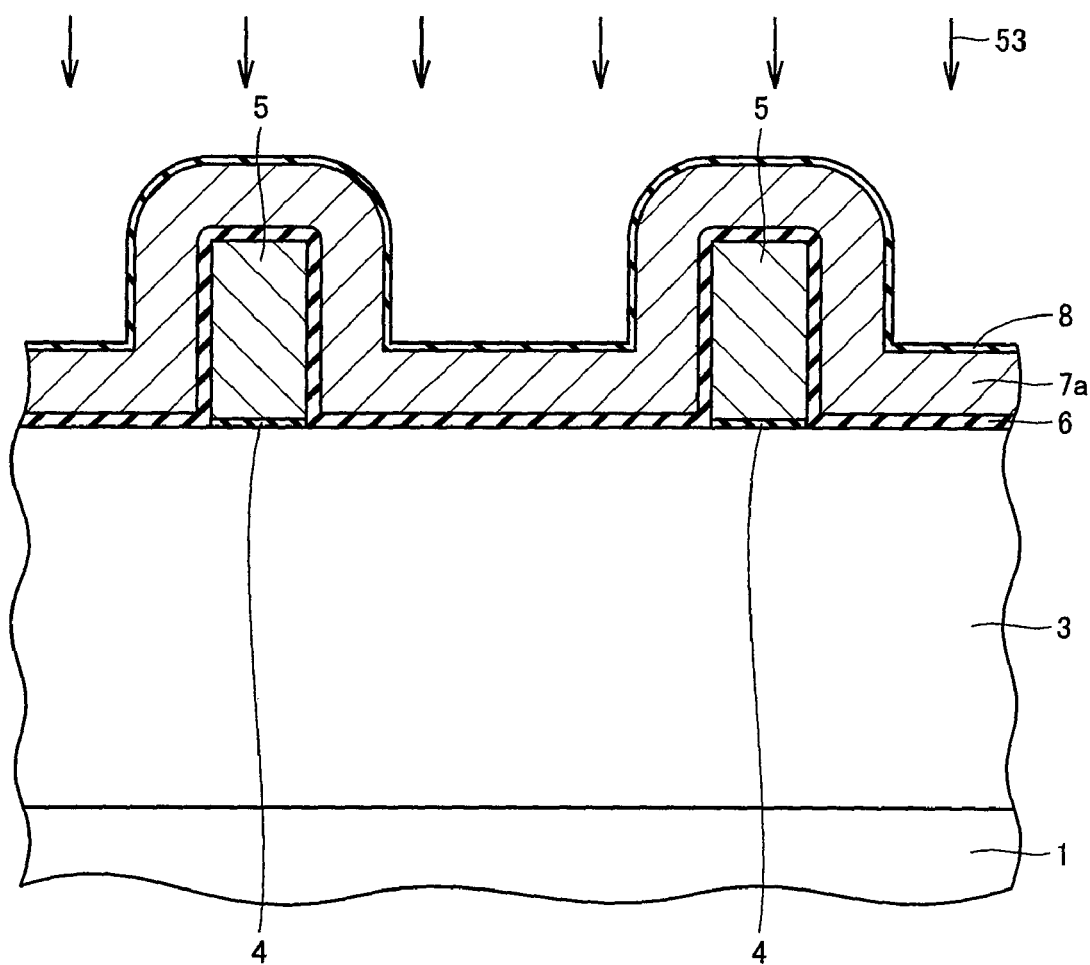
FIG. 20 illustrates a second step in the manufacturing method of the semiconductor device according to the second embodiment.

FIG. 20 is a sectional view schematically illustrating a second step in the manufacturing method of the semiconductor device according to this embodiment. Next, a storage node insulating film 6 serving as a charge accumulation film is formed so as to cover the surface of semiconductor substrate 1 and a surface of control gate electrode 5. For example, an ONO film is formed as storage node insulating film 6.

Next, a second electrode formation step is carried out for forming a second electrode. A memory gate electrode layer 7a serving as a second electrode layer is formed on a surface of storage node insulating film 6. An auxiliary film 8 is formed on a surface of memory gate electrode layer 7a. Auxiliary film 8 formed herein has an etching rate slower than that of memory gate electrode layer 7a in a later etching step.

Next, anisotropic etching is performed as shown by an arrow 53. In auxiliary film 8, a portion extending in the horizontal direction is removed by performance of the anisotropic etching. Next, memory gate electrode layer 7a is removed partially.

Figure 21:
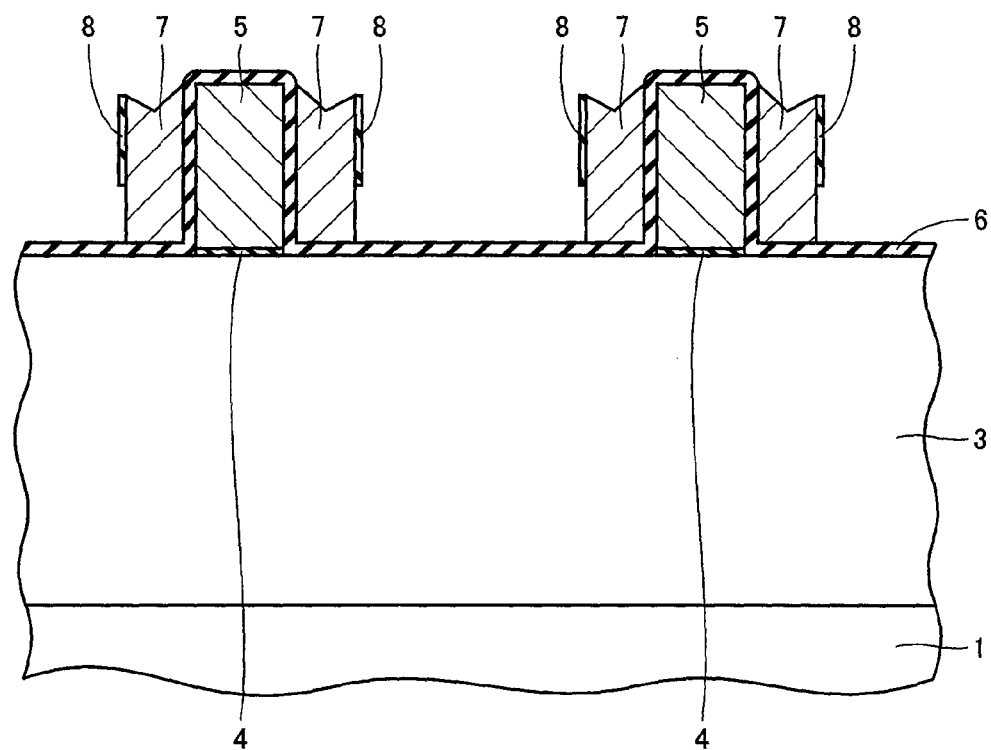
FIG. 21 illustrates a third step in the manufacturing method of the semiconductor device according to the second embodiment.

FIG. 21 is a sectional view schematically illustrating a third step in the manufacturing method of the semiconductor device according this embodiment. More specifically, FIG. 21 illustrates a state after completion of anisotropic etching. Memory gate electrodes 7 each having a substantially square sectional shape are formed on both sides of control gate electrode 5. Each memory gate electrode 7 is formed so as to have a top face in which a substantially center portion is recessed in a width direction. Also in this embodiment, as described above, auxiliary film 8 is formed on the surface of memory gate electrode 7a. Thus, it is possible to prevent that the top face of memory gate electrode 7 becomes low toward an outer side.

Figure 22:
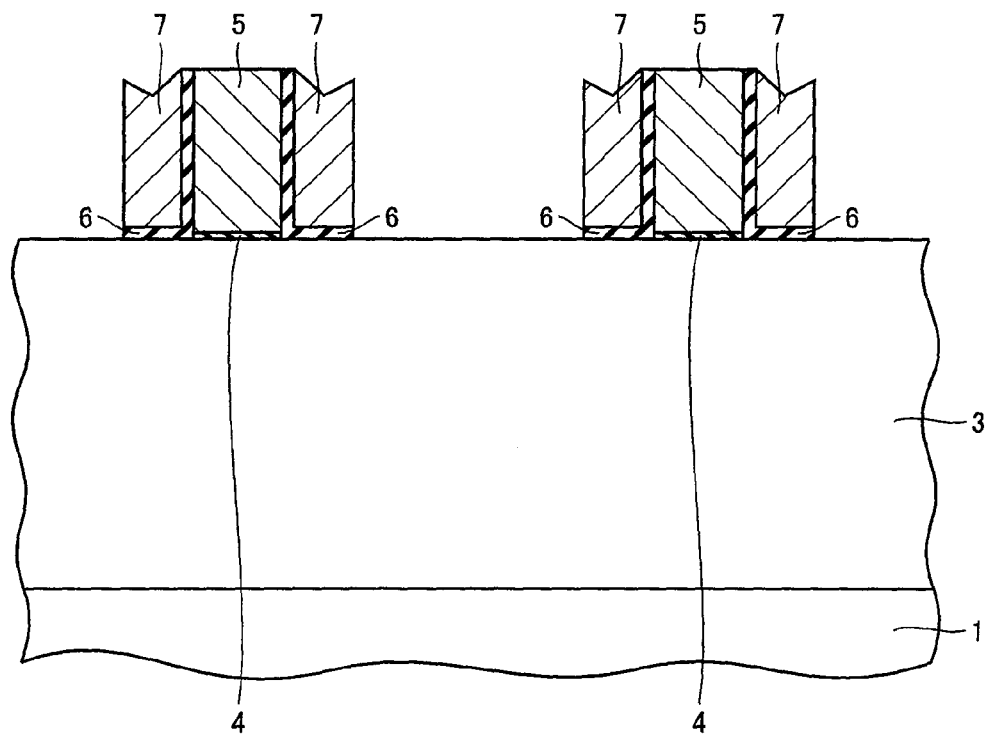
FIG. 22 illustrates a fourth step in the manufacturing method of the semiconductor device according to the second embodiment.

FIG. 22 is a sectional view schematically illustrating a fourth step in the manufacturing method of the semiconductor device according to this embodiment. Next, auxiliary film 8 remained on the side face of memory gate electrode 7, is removed by wet etching. Further, in storage node insulating film 6, a portion other than a portion interposed between control gate electrode 5 and memory gate electrode 7 and a portion interposed between semiconductor substrate 1 and memory gate electrode 7 is removed by anisotropic etching.

Figure 23:
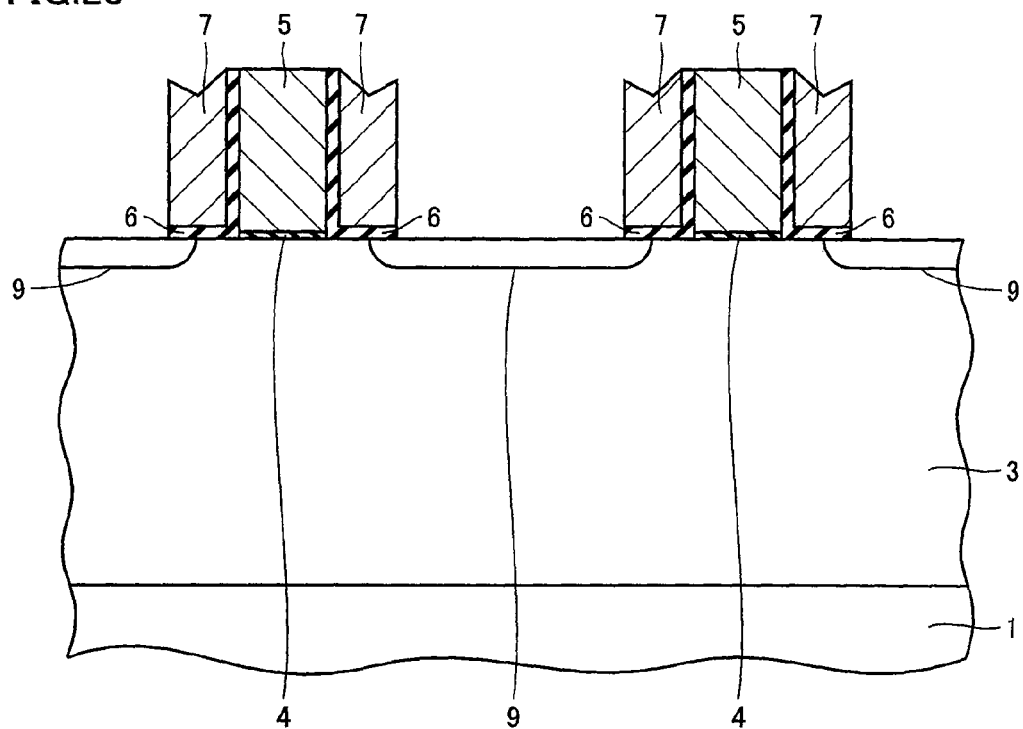
FIG. 23 illustrates a fifth step in the manufacturing method of the semiconductor device according to the second embodiment.

FIG. 23 is a sectional view schematically illustrating a fifth step in the manufacturing method of the semiconductor device according to this embodiment. Next, ion implantation is performed in a self aligned manner while using each of control gate electrode 5 and memory gate electrode 7 as a mask, so that an extension diffusion layer 9 is formed.

Figure 24:
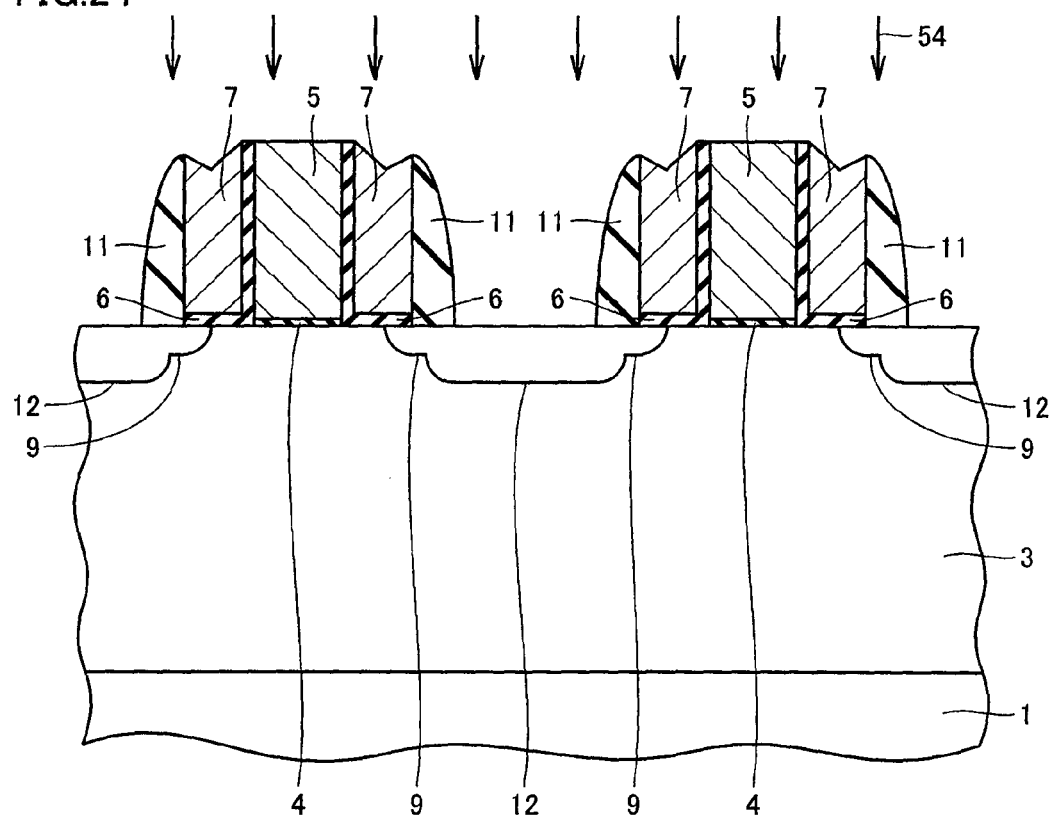
FIG. 24 illustrates a sixth step in the manufacturing method of the semiconductor device according to the second embodiment.

FIG. 24 is a sectional view schematically illustrating a sixth step in the manufacturing method of the semiconductor device according to this embodiment. Next, a sidewall insulating film 11 is formed. Next, as shown by an arrow 54, ion implantation is performed, so that a diffusion layer 12 is formed. Herein, ions with high energy are implanted into semiconductor substrate 1. Memory gate electrode 7 has a sufficiently high minimum height; therefore, it is possible to prevent that ions to be implanted transmit through memory gate electrode 7 to reach storage node insulating film 6.

Figure 25:
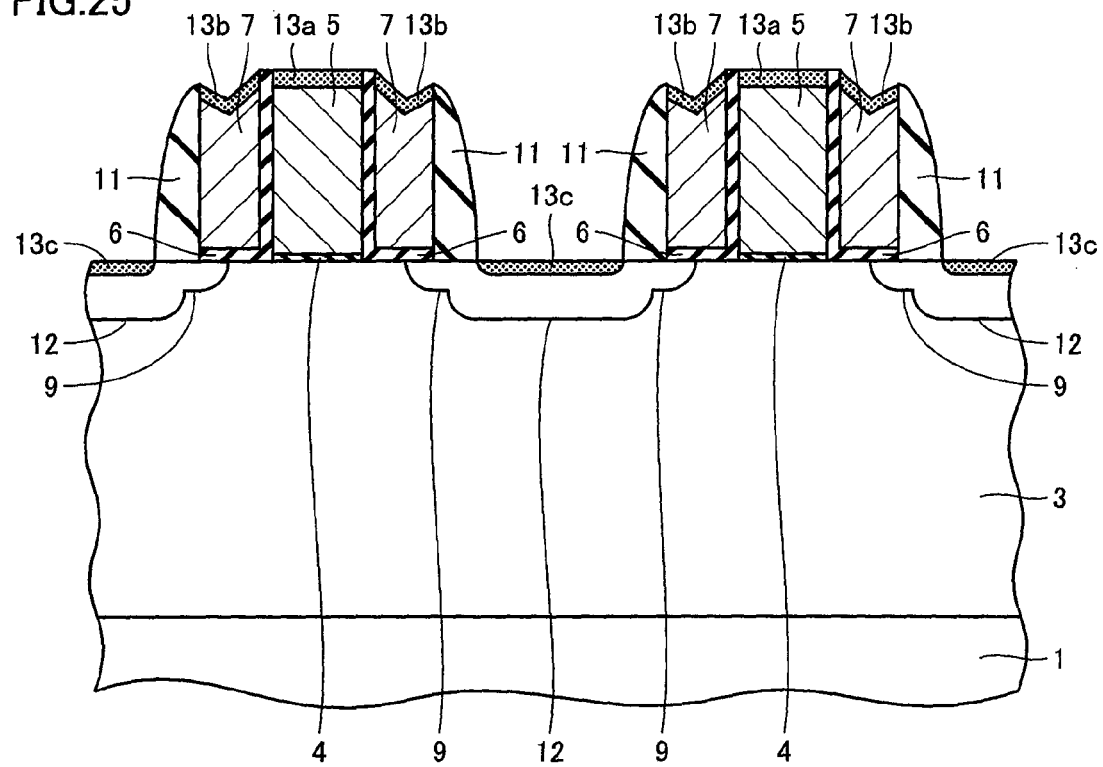
FIG. 25 illustrates a seventh step in the manufacturing method of the semiconductor device according to the second embodiment.

FIG. 25 is a sectional view schematically illustrating a seventh step in the manufacturing method of the semiconductor device according to this embodiment. Next, in the surface of semiconductor substrate 1, a silicide film 13c is formed on a bared portion. Concurrently with the formation of silicide film 13c, a silicide film 13a is formed on a top face of control gate electrode 5 and a silicide film 13b is formed on a top face of memory gate electrode 7.

Thereafter, a protection insulating film is formed so as to cover a cell. Further, an interlayer insulating film is provided on a surface of the protection insulating film, and a contact hole is formed in the interlayer insulating film. Then, a contact is formed in the contact hole.

The manufacturing method of the semiconductor device according to this embodiment has the following advantage. That is, in a second electrode formation step of forming a second electrode, anisotropic etching is performed in such a manner that an auxiliary film having an etching rate slower than that of a second electrode layer is formed on a surface of the second electrode layer; therefore, a memory gate electrode can have a top face in which a center portion is recessed in a width direction. Thus, it is possible to make a difference between a minimum height and a maximum height of the memory gate electrode small, and to make the maximum height of the memory gate electrode low. As a result, it is possible to finely manufacture a semiconductor device. In addition, it is possible to provide a semiconductor device which is improved in controllability of a length of a width of a memory gate electrode and is small in a width direction.

The other configurations, actions, effects and manufacturing processes are similar to those in the first embodiment; therefore, specific description thereof will not be repeated here.

Third Embodiment

Description will be given of a semiconductor device according to a third embodiment of the present invention with reference to FIGS. 26 to 35. The semiconductor device according to this embodiment is a nonvolatile memory in which a charge accumulation film is formed on a surface of a semiconductor substrate and no charge accumulation film is formed on a side face of a control gate electrode.

Figure 26:
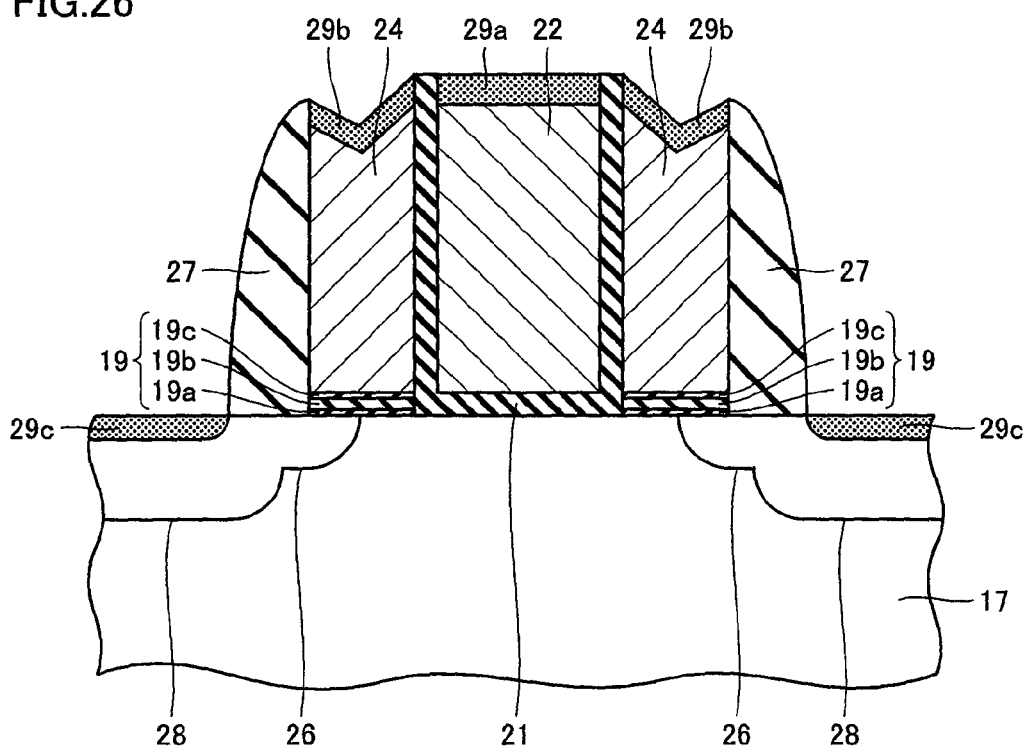
FIG. 26 is an enlarged sectional view schematically illustrating a memory cell in a semiconductor device according to a third embodiment.

FIG. 26 is a sectional view schematically illustrating the semiconductor device according to this embodiment. In the semiconductor device according this embodiment, a control gate electrode 22 is formed above a surface of a semiconductor substrate 17 with a control gate insulating film 21 serving as a first insulating film interposed between control gate electrode 22 and semiconductor substrate 17. Control gate electrode 22 is formed so as to have a square sectional shape. Control gate insulating film 21 is interposed between control gate electrode 22 and semiconductor substrate 17 and between control gate electrode 22 and memory gate electrode 24. Control gate insulating film 21 is formed on a bottom face and side faces of control gate electrode 22.

A storage node insulating film 19 is formed beside control gate electrode 22 on the surface of semiconductor substrate 17. Storage node insulating film 19 is interposed between semiconductor substrate 17 and memory gate electrode 24. Storage node insulating film 19 includes silicon oxide films 19a and 19c and an silicon nitride film 19b.

A memory gate electrode 24 is formed on a top face of storage node insulating film 19. Memory gate electrode 24 is formed so as to have a substantially square sectional shape. Memory gate electrode 24 is formed such that a surface facing to control gate electrode 22 is substantially parallel with a surface facing to a sidewall insulating film 27. Memory gate electrode 24 is formed such that a width becomes substantially constant in a height direction in a sectional shape thereof. Memory gate electrode 24 is formed so as to have a top face in which a substantially center portion is recessed in a width direction.

A silicide film 29a is formed on a top face of control gate electrode 22. A silicide film 29b is formed on a top face of a memory gate electrode 24. An extension diffusion layer 26 is formed on the surface of semiconductor substrate 17 so as to extend from a bottom side of memory gate electrode 24 toward an outer side of a memory cell.

Sidewall insulating film 27 is formed on a side face of memory gate electrode 24 and a side face of storage node insulating film 19. A diffusion layer 28 is formed on the surface of semiconductor substrate 17 so as to extend from a bottom side of sidewall insulating film 27 toward the outer side of the memory cell. A silicide film 29c is formed beside sidewall insulating film 27 on the surface of semiconductor substrate 17.

Description will be given of a manufacturing method of the semiconductor device according to this embodiment with reference to FIGS. 27 to 34.

Figure 27:
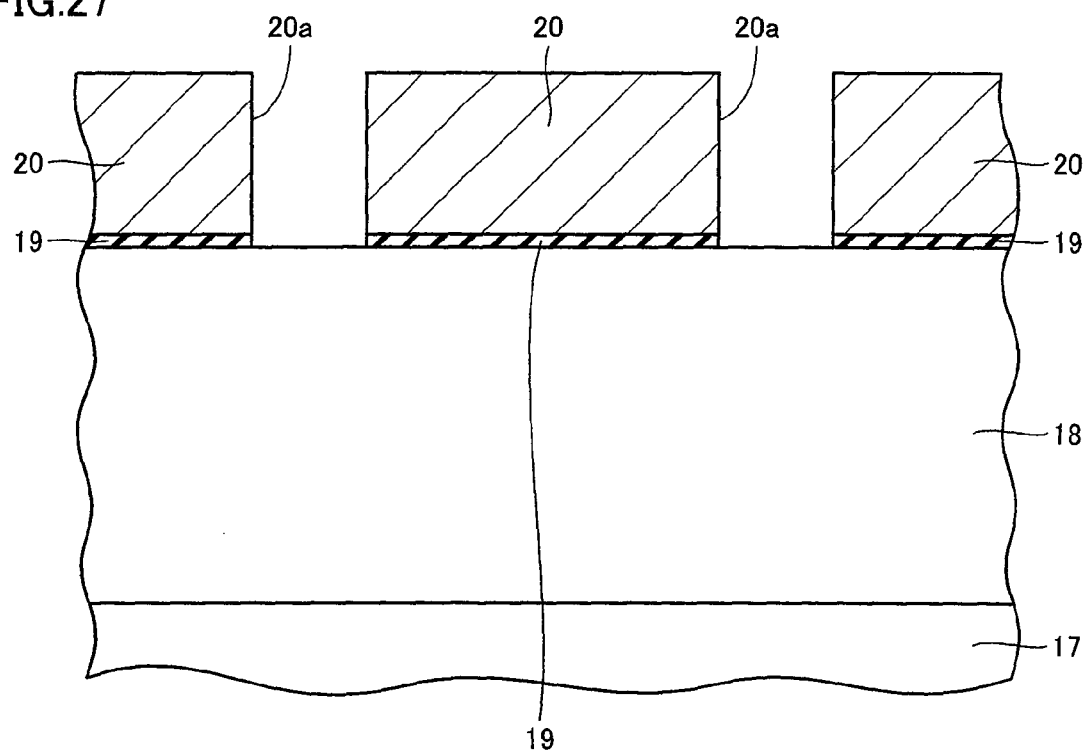
FIG. 27 illustrates a first step in a manufacturing method of the semiconductor device according to the third embodiment.

FIG. 27 is a sectional view schematically illustrating a first step in the manufacturing method of the semiconductor device according to this embodiment. First, a first electrode formation step is carried out for forming a control gate electrode serving as a first electrode. A memory well portion 18 is formed on a surface of a semiconductor substrate 17. Next, a storage node insulating film 19 and a dummy layer 20 are formed on the surface of semiconductor substrate 17. For example, a lamination of an silicon oxide film, an silicon nitride film and an silicon oxide film is used as storage node insulating film 19, and an silicon nitride film is used as dummy layer 20.

Next, an opening 20a is formed in dummy layer 20 and storage node insulating film 19 by photolithography. Opening 20a is formed so as to reach the surface of semiconductor substrate 17.

Figure 28:
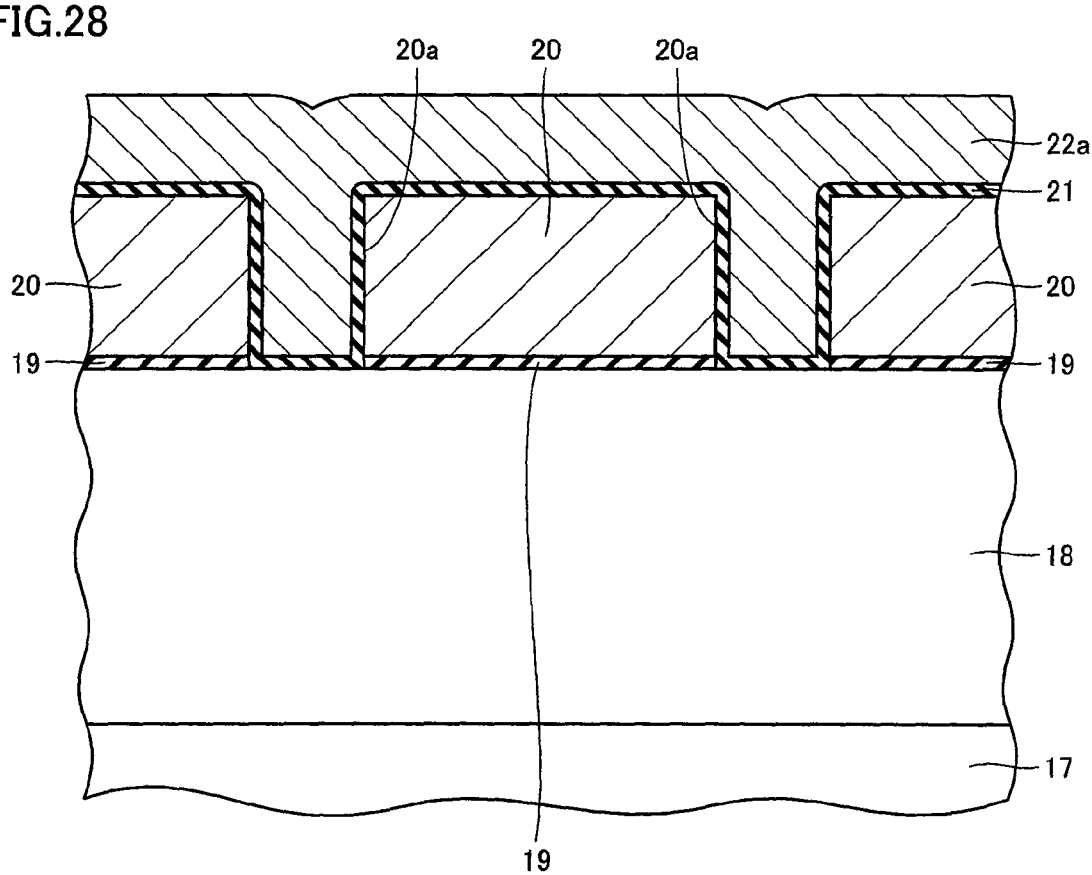
FIG. 28 illustrates a second step in the manufacturing method of the semiconductor device according to the third embodiment.

FIG. 28 is a sectional view schematically illustrating a second step in the manufacturing method of the semiconductor device according to this embodiment. Next, a control gate insulating film 21 is formed on a surface of dummy layer 20 including opening 20a and a surface of semiconductor substrate 17 having opening 20a formed therein. For example, an silicon oxide film is used as control gate insulating film 21. Next, a control gate electrode layer 22a serving as a control gate electrode is formed on a surface of control gate insulating film 21. Control gate electrode layer 22a is formed such that opening 20a is filled therewith.

Figure 29:
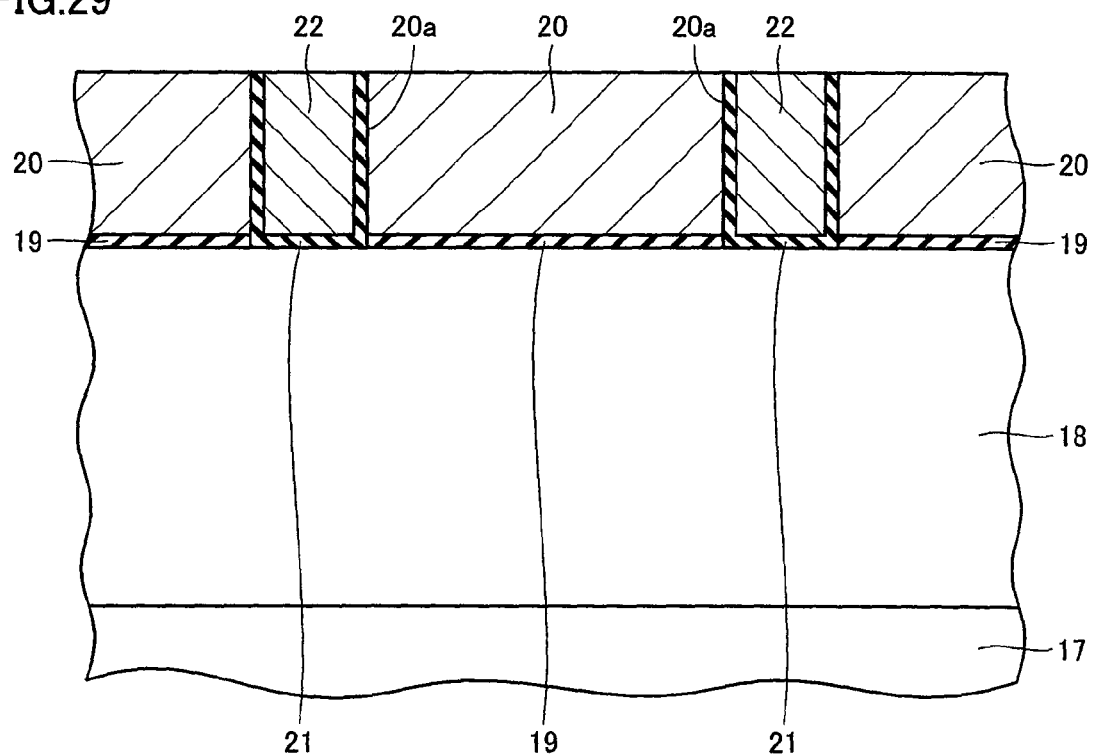
FIG. 29 illustrates a third step in the manufacturing method of the semiconductor device according to the third embodiment.

FIG. 29 is a sectional view schematically illustrating a third step in the manufacturing method of the semiconductor device according to this embodiment. Next, in control gate electrode layer 22a, a portion higher in height than dummy layer 20 and a portion corresponding to control gate insulating film 21 formed on a top face of dummy layer 20 are removed by, for example, chemical mechanical polishing. In other words, portions higher in height than opening 20a are removed in control gate insulating film 21 and control gate electrode layer 22a. By this removal step, a control gate electrode 22 serving as a first electrode is formed. A control gate insulating film 21 serving as a first insulating film is formed on a bottom face and a side face of control gate electrode 22.

Figure 30:
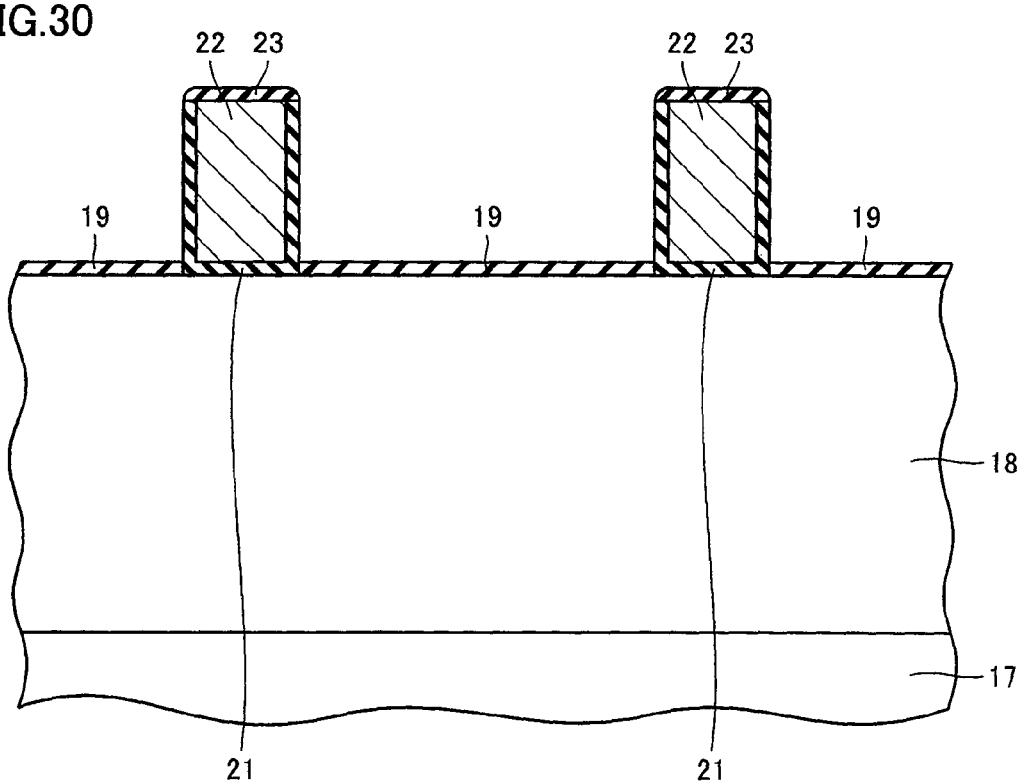
FIG. 30 illustrates a fourth step in the manufacturing method of the semiconductor device according to the third embodiment.

FIG. 30 is a sectional view schematically illustrating a fourth step in the manufacturing method of the semiconductor device according to this embodiment. Next, a control gate protection film 23 serving as a second insulating film is formed on a top face of control gate electrode 22 by photolithography. Next, dummy layers 20 provided on both sides of control gate insulating film 21 are removed.

Figure 31:
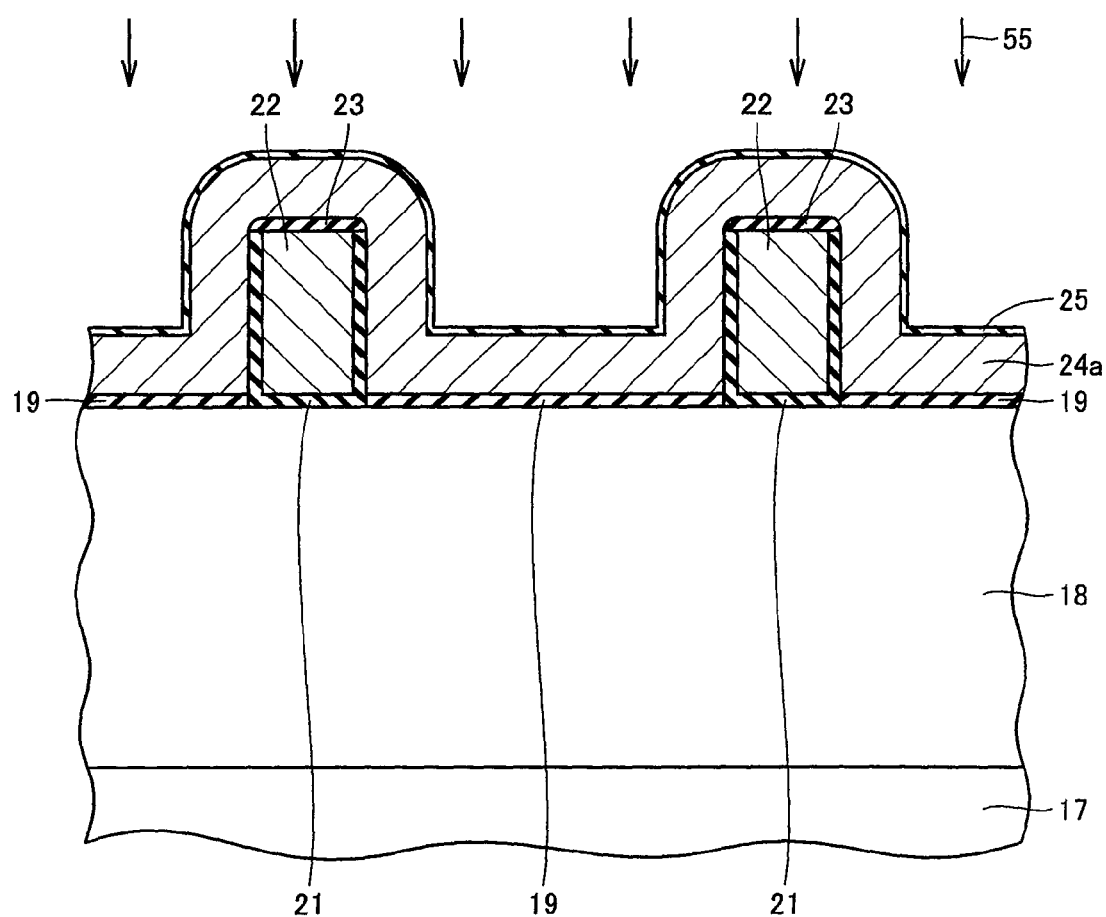
FIG. 31 illustrates a fifth step in the manufacturing method of the semiconductor device according to the third embodiment.

FIG. 31 is a sectional view schematically illustrating a fifth step in the manufacturing method of the semiconductor device according to this embodiment. Next, a memory gate electrode layer 24a serving as a second electrode layer is formed on a surface of storage node insulating film 19, a surface of control gate insulating film 21 and a surface of control gate protection film 23. Further, an auxiliary film 25 is formed on a surface of memory gate electrode layer 24a. Auxiliary film 25 formed herein has an etching rate slower than that of memory gate electrode layer 24a in a later etching step. Next, anisotropic etching is performed as shown by an arrow 55.

Figure 32:
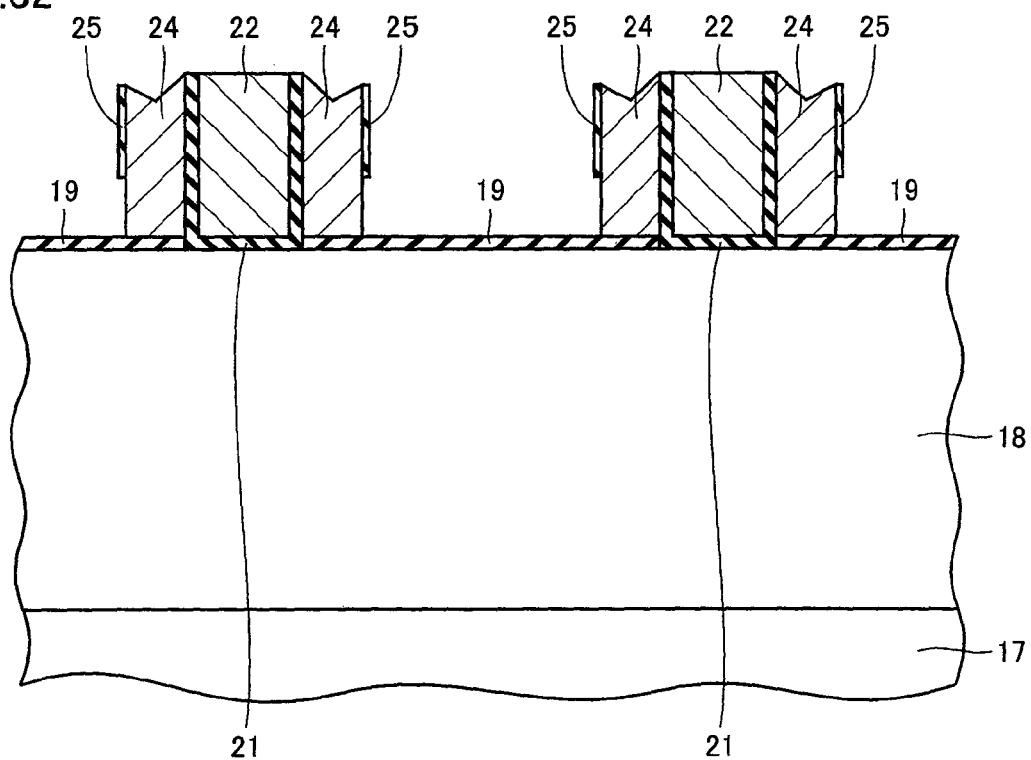
FIG. 32 illustrates a sixth step in the manufacturing method of the semiconductor device according to the third embodiment.

FIG. 32 is a sectional view schematically illustrating a sixth step in the manufacturing method of the semiconductor device according to this embodiment. More specifically, FIG. 32 illustrates a state after completion of anisotropic etching. Memory gate electrodes 24 are formed on both sides of control gate electrode 22 with control gate insulating film 21 interposed between each memory gate electrode 24 and control gate electrode 22. Memory gate electrode 24 has a top face in which a substantially center portion is recessed in a width direction. Auxiliary film 25 is partially remained on the side face of memory gate electrode 24.

Figure 33:
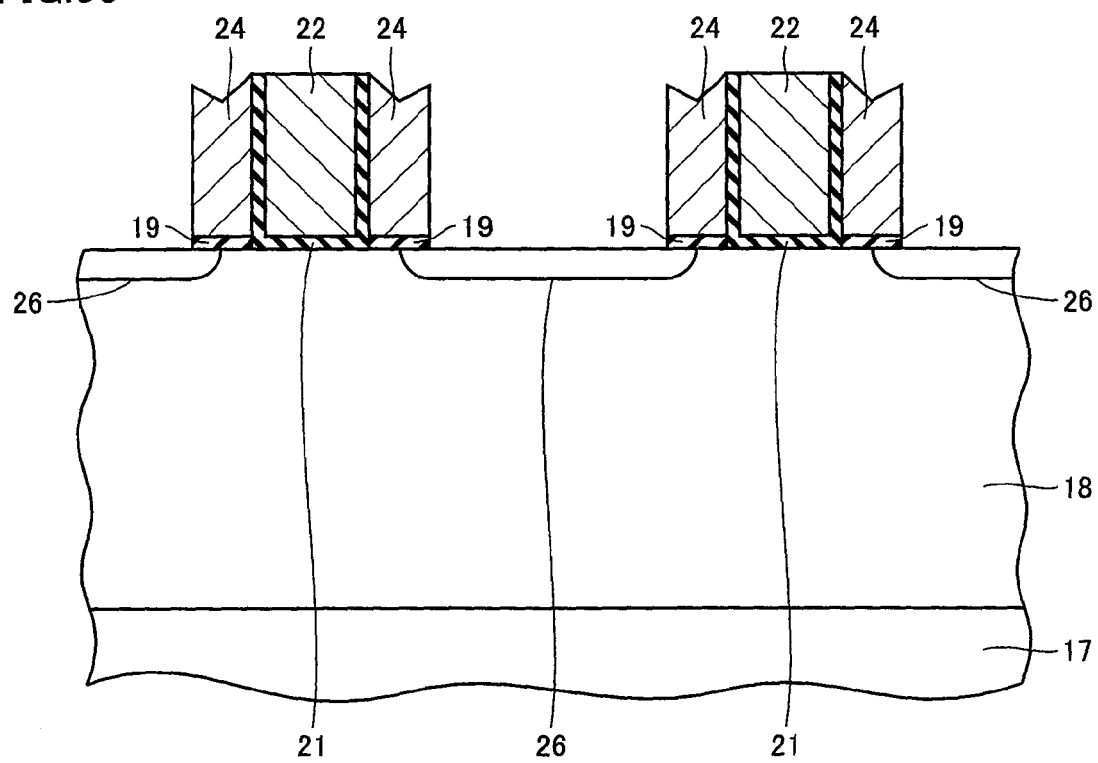
FIG. 33 illustrates a seventh step in the manufacturing method of the semiconductor device according to the third embodiment.

FIG. 33 is a sectional view schematically illustrating a seventh step in the manufacturing method of the semiconductor device according to this embodiment. Next, remained auxiliary film 25 is removed by etching. Further, in storage node insulating film 19, a bared portion is removed by etching. Storage node insulating film 19 is remained on a region interposed between memory gate electrode 24 and semiconductor substrate 17. Next, ion implantation is performed to form an extension diffusion layer 26.

Figure 34:
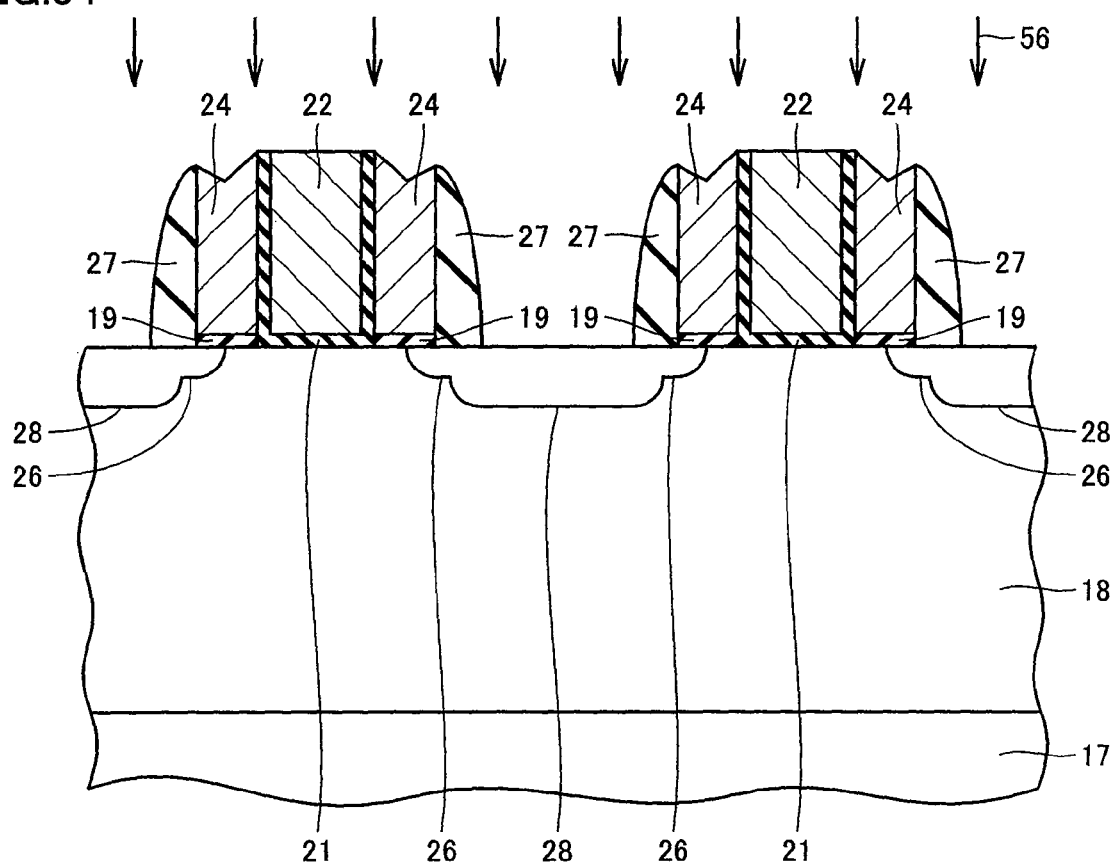
FIG. 34 illustrates an eighth step in the manufacturing method of the semiconductor device according to the third embodiment.

FIG. 34 is a sectional view schematically illustrating an eighth step in the manufacturing method of the semiconductor device according to this embodiment. Next, a sidewall insulating film 27 is formed on a side face of memory gate electrode 24 and a side face of storage node insulating film 19. Next, as shown by an arrow 56, a diffusion layer 28 is formed in a self aligned manner. Also in an ion implantation step of forming diffusion layer 28, memory gate electrode 24 has a sufficient high minimum height. Therefore, it is possible to prevent that ions transmit through memory gate electrode 24 to reach storage node insulating film 19.

Figure 35:
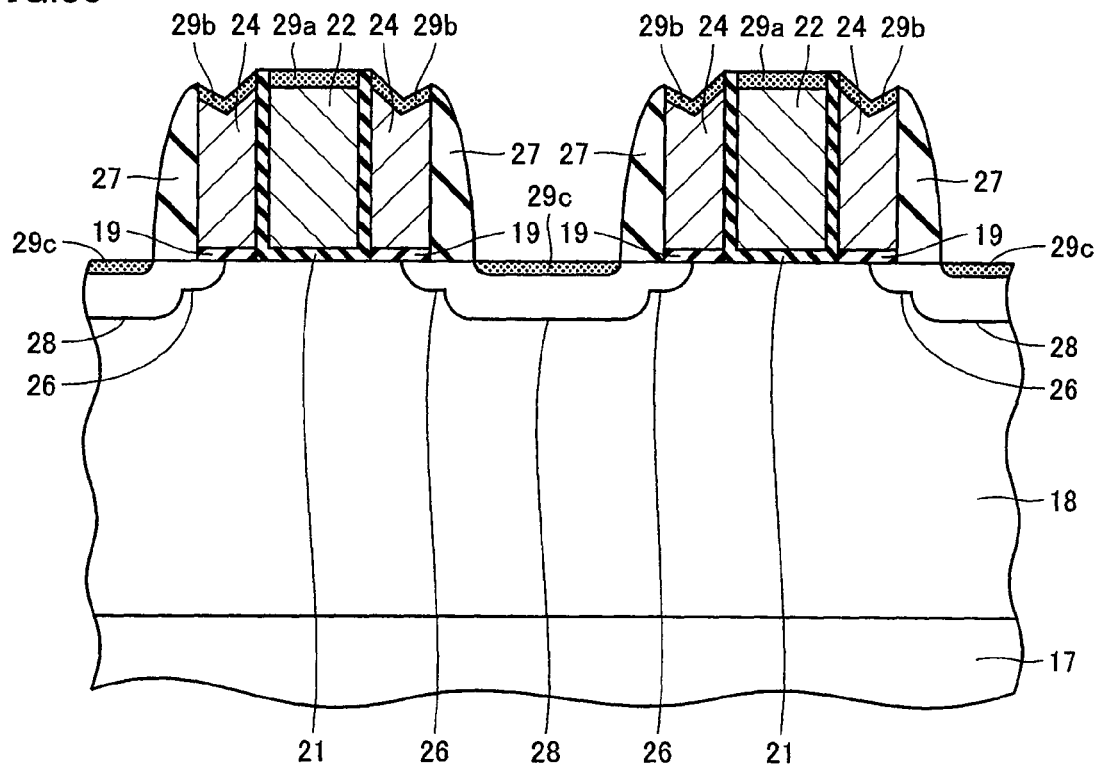
FIG. 35 illustrates a ninth step in the manufacturing method of the semiconductor device according to the third embodiment.

FIG. 35 is a sectional view schematically illustrating a ninth step in the manufacturing method of the semiconductor device according to this embodiment. Next, a silicide film 29c is formed on the surface of semiconductor substrate 17. Herein, a silicide film 29a is formed on a top face of control gate electrode 22 and a silicide film 29b is formed on a top face of memory gate electrode 24.

Also by the manufacturing method of the semiconductor device according to this embodiment, it is possible to manufacture a fine semiconductor device.

The other configurations, actions, effects and manufacturing processes are similar to those in the first and second embodiments; therefore, specific description thereof will not be repeated.

Fourth Embodiment

Description will be given of a semiconductor device according to a fourth embodiment of the present invention with reference to FIGS. 36 to 43. The semiconductor device in this embodiment is a MOS (Metal Oxide Semiconductor) transistor.

Figure 36:
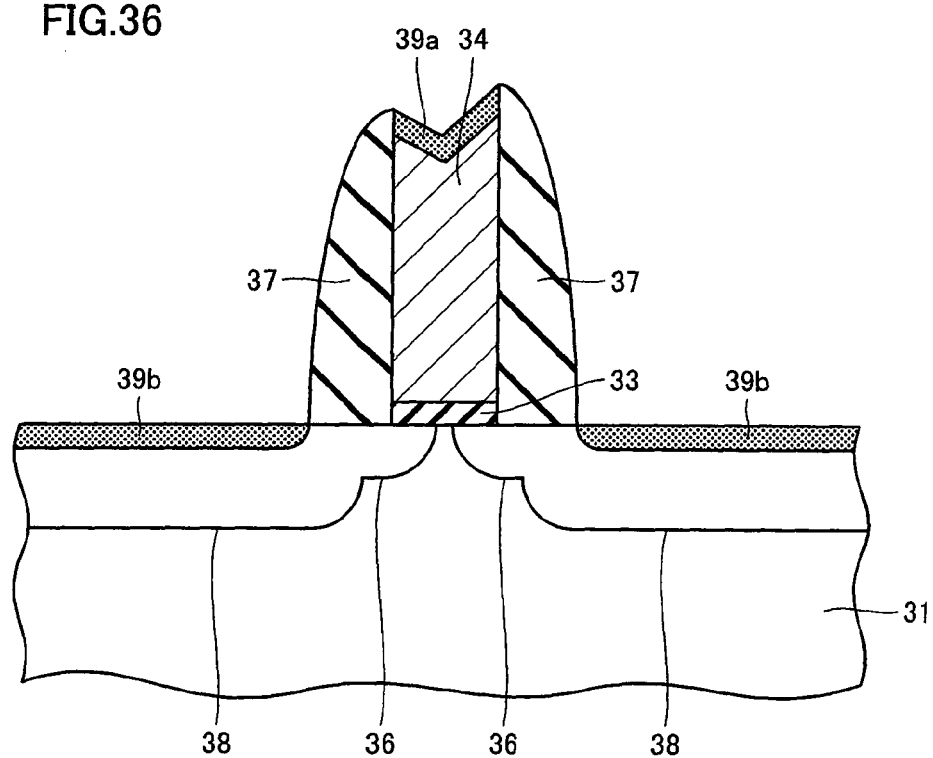
FIG. 36 is an enlarged sectional view schematically illustrating a semiconductor device according to a fourth embodiment.

FIG. 36 is a sectional view schematically illustrating the semiconductor device according to this embodiment. A gate electrode 34 is formed above a surface of a semiconductor substrate 31 with a gate insulating film 33 interposed between gate electrode 34 and semiconductor substrate 31. Sidewall insulating films 37 are formed on side faces of gate electrode 34.

Extension diffusion layers 36 are formed on the surface of semiconductor substrate 31 so as to extend from a bottom side of gate electrode 34 toward an outer side. Extension diffusion layers 36 are formed on both sides of semiconductor substrate 31 in a width direction. In addition, diffusion layers 38 are formed on the surface of semiconductor substrate 31 so as to extend from a bottom side of sidewall insulating film 37 toward the outer side. A silicide film 39b is formed beside each sidewall insulating film 37 on the surface of semiconductor substrate 31.

Gate electrode 34 is formed such that surfaces facing to sidewall insulating films 37 are substantially parallel with each other in a sectional shape thereof. Gate electrode 34 is formed so as to have a substantially square sectional shape. Gate electrode 34 is formed such that a substantially center portion of a top face is recessed in a width direction in the sectional shape thereof. In this embodiment, the top face of gate electrode 34 has a substantially "V"-shaped sectional shape. A silicide film 39a is formed on the top face of gate electrode 34.

The semiconductor device according to this embodiment is excellent in dimensional accuracy of a width of gate electrode 34. As a result, it is possible to provide a fine semiconductor device having a gate electrode small in width. The improvement in dimensional accuracy of the gate electrode improves dimensional accuracy of a diffusion layer and, also, improves a process margin upon formation of the diffusion layer. Further, when ions are implanted in a step of forming the diffusion layer, it is possible to prevent that the ions transmit through a gate electrode to reach a gate insulating film. As a result, it is possible to suppress a change in transistor characteristics due to implantation of ions into the gate insulating film.

Description will be given of a manufacturing method of the semiconductor device according to this embodiment with reference to FIGS. 37 to 43.

Figure 37:
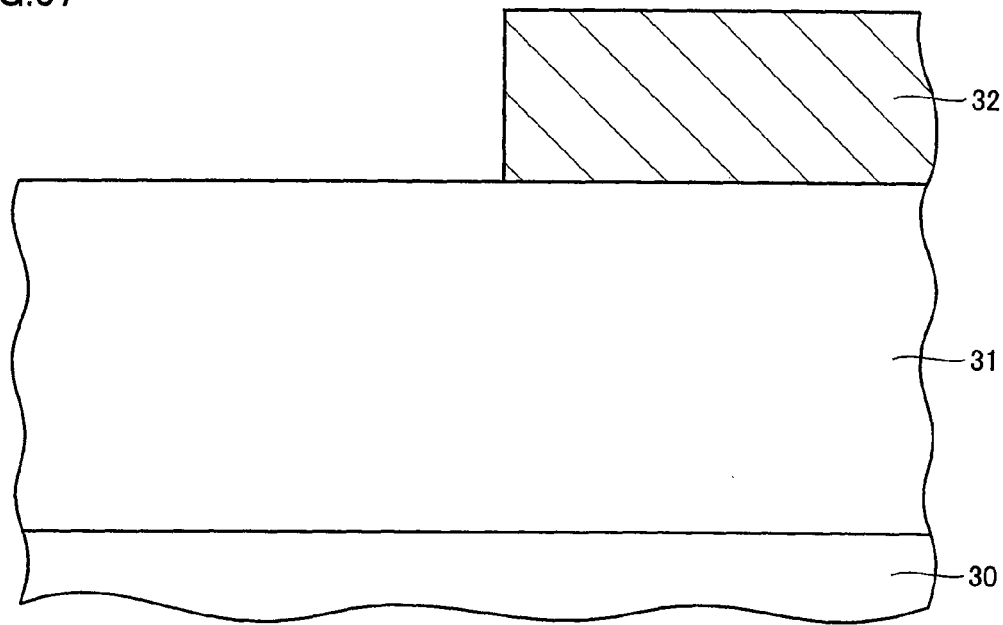
FIG. 37 illustrates a first step in a manufacturing method of the semiconductor device according to the fourth embodiment.

FIG. 37 is a sectional view schematically illustrating a first step in the manufacturing method of the semiconductor device according to this embodiment. As illustrated in FIG. 37, first, a well portion 31 is formed on semiconductor substrate 30. A dummy layer 32 having side faces is formed on a surface of semiconductor substrate 30 by photolithography. For example, an silicon nitride film is used as dummy layer 32.

Figure 38:
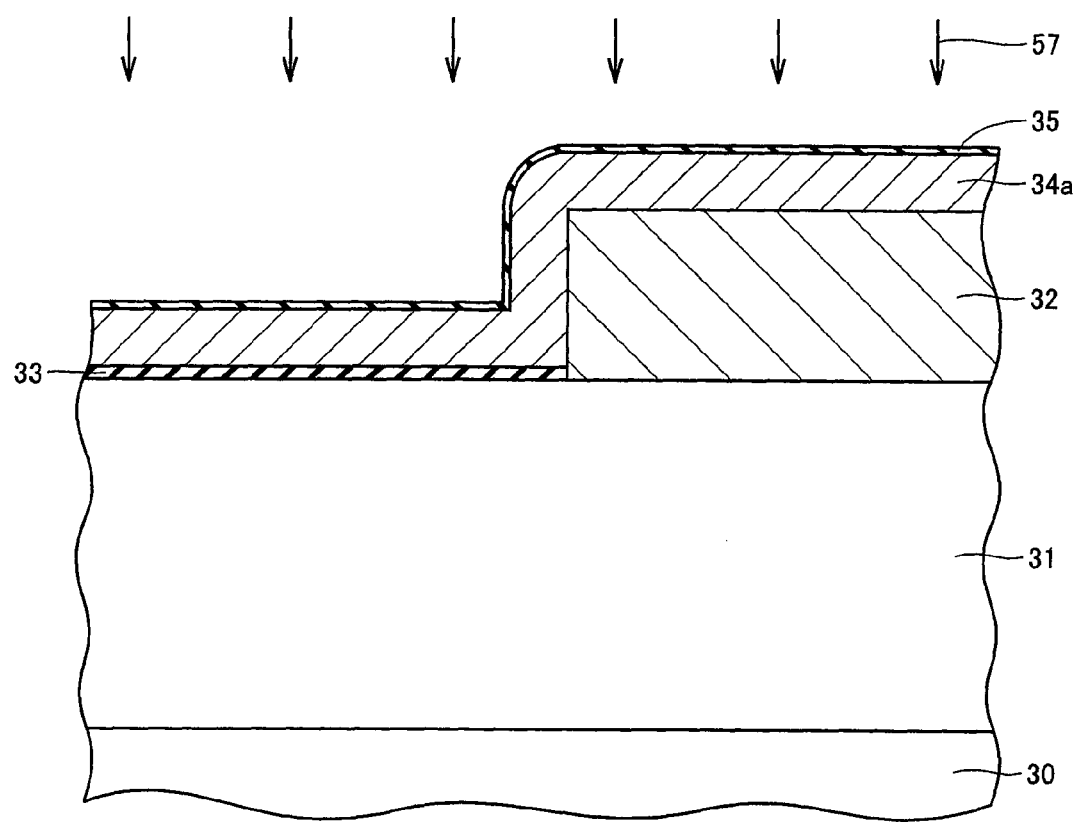
FIG. 38 illustrates a second step in the manufacturing method of the semiconductor device according to the fourth embodiment.

FIG. 38 is a sectional view schematically illustrating a second step in the manufacturing method of the semiconductor device according to this embodiment. Next, in the surface of semiconductor substrate 30, a gate insulating film 33 is formed on a bared portion by photolithography. Gate insulating film 33 is formed so as to come into contact with the side face of dummy layer 32. Next, a gate electrode layer 34a is formed on a surface of dummy layer 32 and a surface of gate insulating film 33. An auxiliary film 35 is formed on a surface of gate electrode layer 34a. Auxiliary film 35 formed herein has an etching rate slower than that of gate electrode layer 34a. Next, as shown by an arrow 57, anisotropic etching is performed on gate electrode layer 34a and auxiliary film 35.

Figure 39:
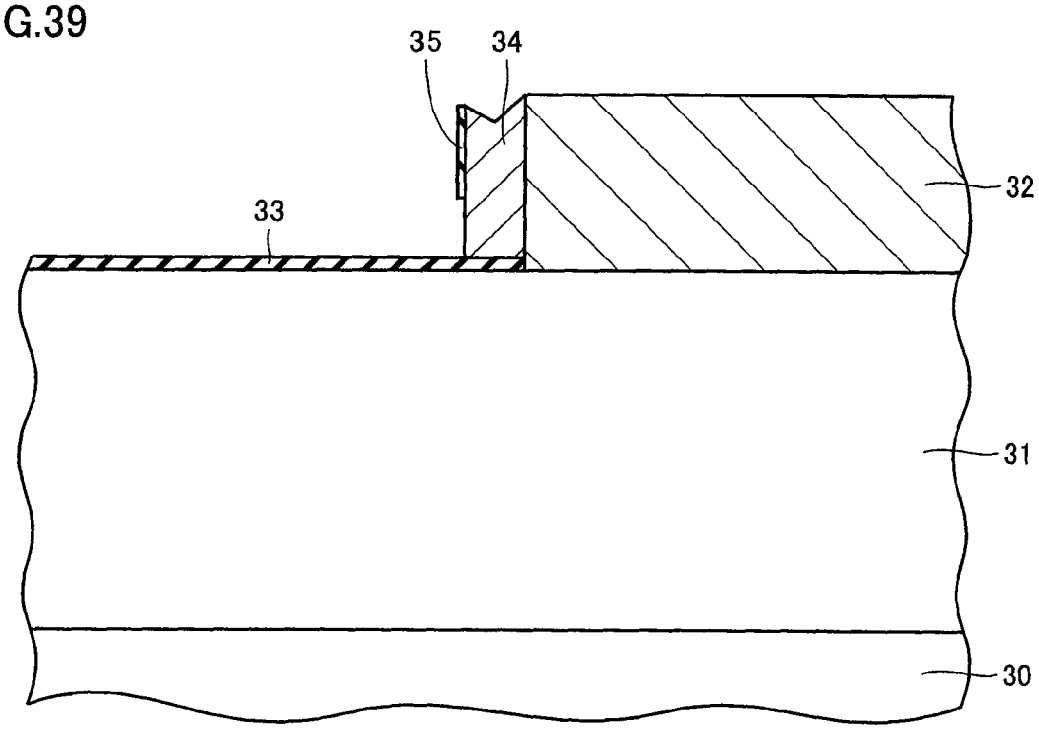
FIG. 39 illustrates a third step in the manufacturing method of the semiconductor device according to the fourth embodiment.

FIG. 39 is a sectional view schematically illustrating a third step in the manufacturing method of the semiconductor device according to this embodiment. More specifically, FIG. 39 illustrates a state after completion of anisotropic etching. Gate electrode layer 34a provided on a top face of dummy layer 32 is removed. In the surface of gate insulating film 33, a portion other than a portion in which gate electrode layer 34a extends in a vertical direction is removed. In other words, gate electrode layer 34a corresponding to a portion coming into contact with the side face of dummy layer 32 is remained. Thus, a gate electrode 34 is formed. Gate electrode 34 has a top face in which a substantially center portion is recessed in a width direction. Next, auxiliary film 35 remained on the side face of gate electrode 34 is removed.

Figure 40:
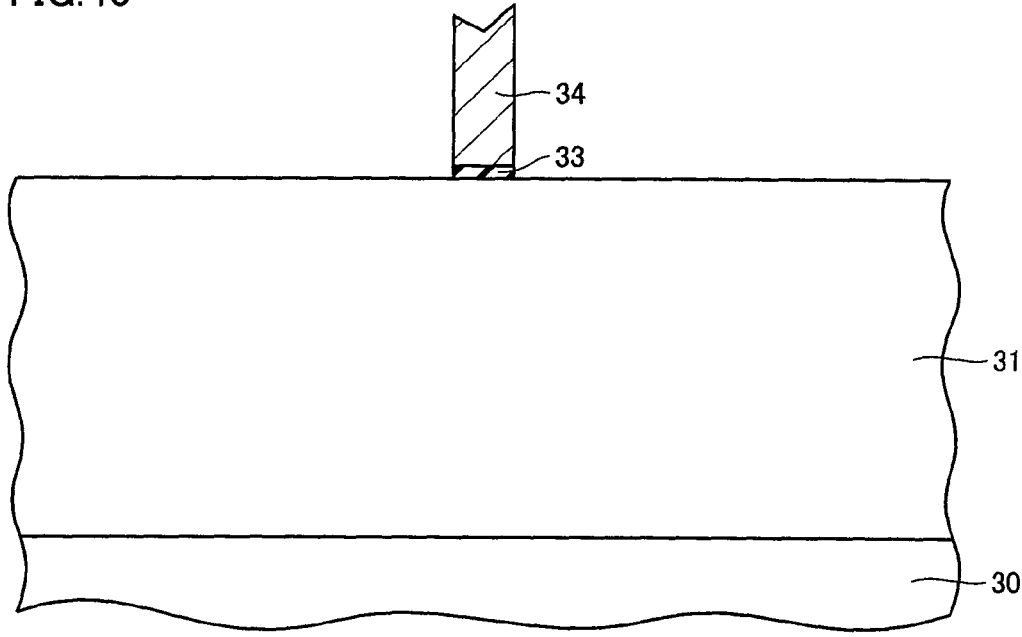
FIG. 40 illustrates a fourth step in the manufacturing method of the semiconductor device according to the fourth embodiment.

FIG. 40 is a sectional view schematically illustrating a fourth step in the manufacturing method of the semiconductor device according to this embodiment. Next, dummy layer 32 is removed. Further, in gate insulating film 33, a portion other than a portion having gate electrode 34 formed thereon is removed.

Figure 41:
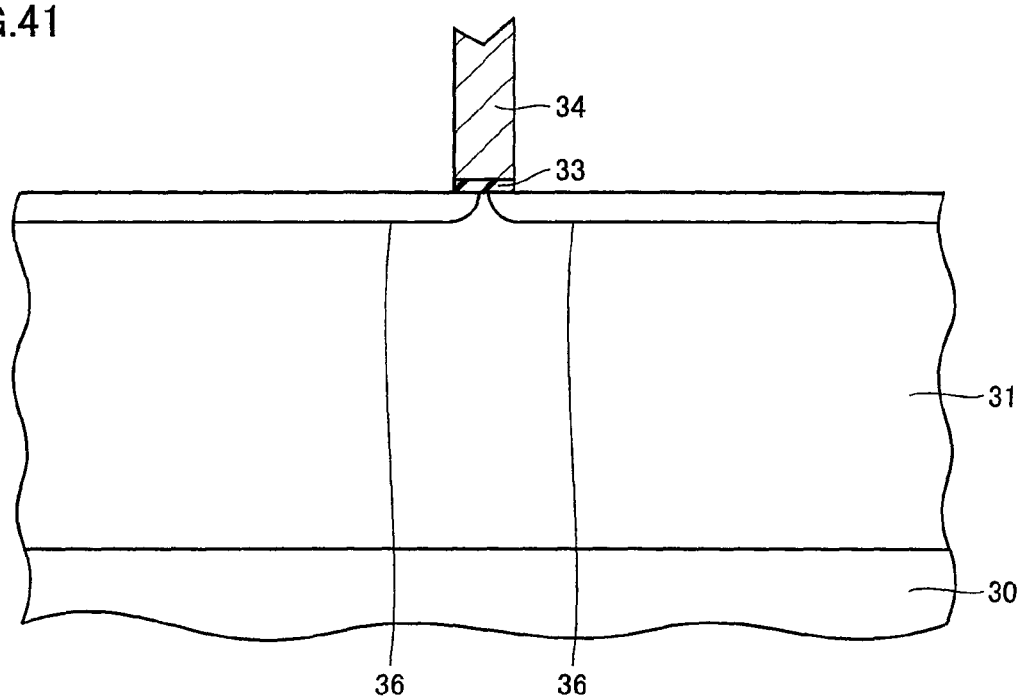
FIG. 41 illustrates a fifth step in the manufacturing method of the semiconductor device according to the fourth embodiment.

FIG. 41 is a sectional view schematically illustrating a fifth step in the manufacturing method of the semiconductor device according to this embodiment. Next, ion implantation is performed to form an extension diffusion layer 36 in a self aligned manner. Herein, extension diffusion layer 36 is formed on the surface of semiconductor substrate 30 so as to extend from a bottom side of gate electrode 34 toward an outer side.

Figure 42:
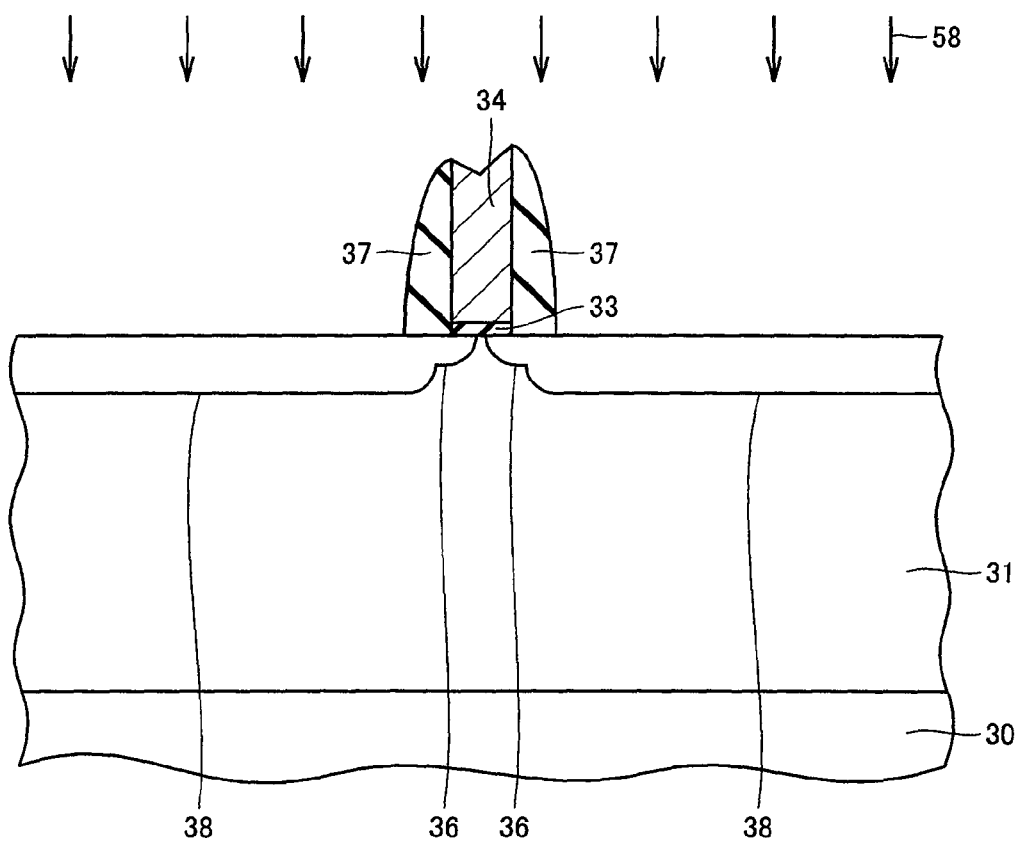
FIG. 42 illustrates a sixth step in the manufacturing method of the semiconductor device according to the fourth embodiment.

FIG. 42 is a sectional view schematically illustrating a sixth step in the manufacturing method of the semiconductor device according to this embodiment. Next, a sidewall insulating film 37 is formed on a side face of gate electrode 34 and a side face of gate insulating film 33. Next, as shown by an arrow 58, ion implantation is performed to form a diffusion layer 38 in a self aligned manner.

Figure 43:
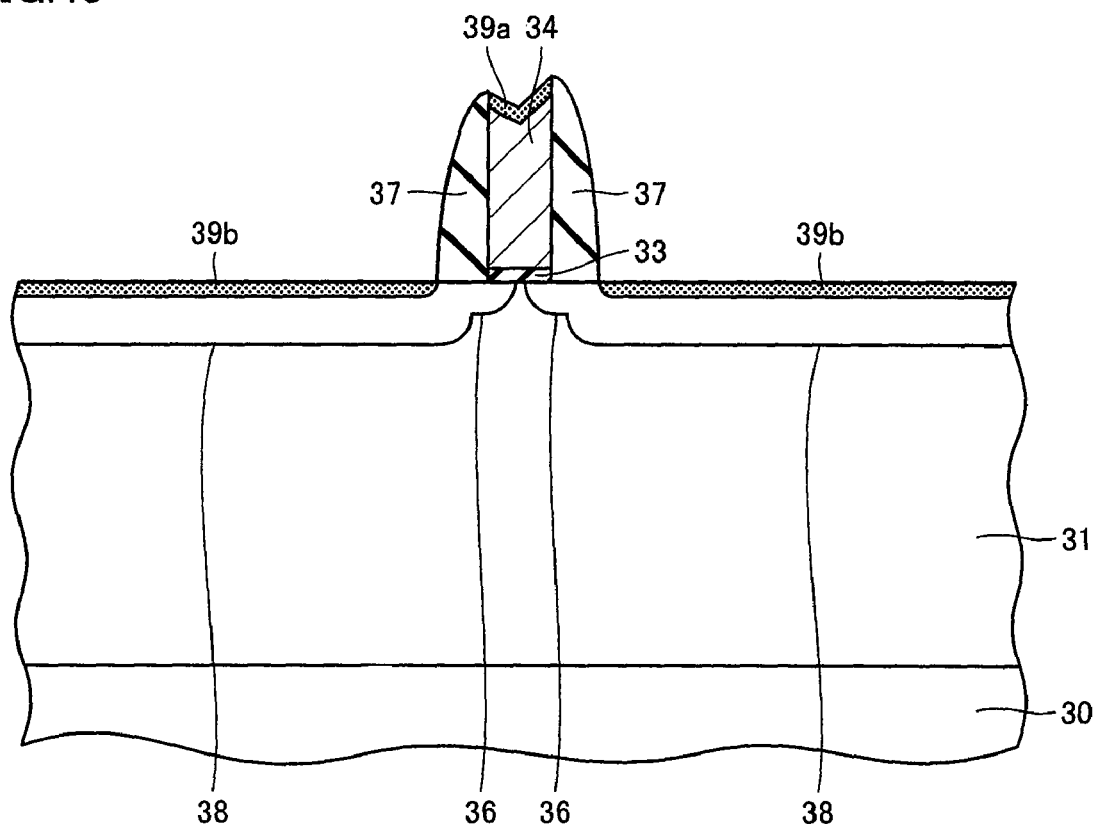
FIG. 43 illustrates a seventh step in the manufacturing method of the semiconductor device according to the fourth embodiment.

FIG. 43 is a sectional view schematically illustrating a seventh step in the manufacturing method of the semiconductor device according to this embodiment. Next, a silicide film 39b is formed beside sidewall insulating film 37 on the surface of semiconductor substrate 30. Herein, a silicide film 39a is formed on a top face of gate electrode 34. Thus, a MOS transistor can be formed on the surface of the semiconductor substrate.

The semiconductor device according to this embodiment and the manufacturing method thereof have the following advantage. That is, an auxiliary film is formed on a top face of a gate electrode layer and anisotropic etching is performed; thus, a semiconductor device having a gate electrode formed with excellent dimensional accuracy can be manufactured. In a manufacturing process of the semiconductor device, further, a process margin is improved.

The other actions and effects are similar to those in the first to third embodiments; therefore, specific description thereof will not be repeated here.

In the aforementioned drawings, identical or corresponding portions are denoted by identical symbols. In the aforementioned description, the terms such as "top side" and "bottom side" do not represent an absolute up and down direction in a normal direction, but relatively represent positional relations of the respective portions.

According to the present invention, it is possible to provide a fine semiconductor device, and a manufacturing method thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device, comprising the steps of:
    forming a first electrode above a surface of a semiconductor substrate with a first insulating film interposed between said first electrode and said semiconductor substrate;
    forming a charge accumulation film beside said first electrode at least on the surface of said semiconductor substrate; and
    forming a second electrode on a surface of said charge accumulation film, wherein
    said step of forming said second electrode includes the steps of:
    forming a second electrode layer on the surface of said charge accumulation film;
    forming an auxiliary film, having an etching rate slower than that of said second electrode layer, on a surface of said second electrode layer; and
    performing anisotropic etching on said second electrode layer and said auxiliary film, thereby forming said second electrode, wherein said second electrode is formed such that a top face is recessed to the substantially V shape.

2. The manufacturing method of a semiconductor device according to claim 1, wherein
    said step of forming said charge accumulation film includes a step of forming a charge accumulation film on the surface of said semiconductor substrate and the surface of said first electrode, and said step of forming said second electrode includes a step of forming said second electrode layer so as to cover said charge accumulation film.

3. The manufacturing method of a semiconductor device according to claim 1, wherein
said step of forming said first electrode includes the steps of:
laminating said charge accumulation film and a dummy film on the surface of said semiconductor substrate;
forming an opening in said charge accumulation film and said dummy film so as to reach the surface of said semiconductor substrate;
forming a first insulating film on the surface of said semiconductor substrate bared in said opening and a surface of said opening;
forming a first electrode layer on a surface of said first insulating film;
removing portions higher in height than said opening in said first insulating film and said first electrode layer, thereby forming said first electrode; and
removing said dummy film.

* * * * *